United States Patent [19]
Chiang et al.

[11] Patent Number: 5,739,579
[45] Date of Patent: Apr. 14, 1998

[54] METHOD FOR FORMING INTERCONNECTIONS FOR SEMICONDUCTOR FABRICATION AND SEMICONDUCTOR DEVICE HAVING SUCH INTERCONNECTIONS

[75] Inventors: Chien Chiang, Fremont; David B. Fraser, Danville, both of Calif.

[73] Assignee: Intel Corporation, Santa Clara, Calif.

[21] Appl. No.: 707,027

[22] Filed: Sep. 10, 1996

Related U.S. Application Data

[60] Continuation of Ser. No. 430,759, Apr. 27, 1995, abandoned, which is a division of Ser. No. 314,248, Sep. 28, 1994, abandoned, which is a continuation-in-part of Ser. No. 905,473, Jun. 29, 1992, Pat. No. 5,612,254.

[51] Int. Cl.$^6$ ............................................. H01L 23/58
[52] U.S. Cl. .................. 257/635; 257/637; 257/640; 257/751; 257/752; 257/762; 257/763; 257/764; 257/774; 257/775
[58] Field of Search ...................... 257/635, 637, 257/640, 751, 752, 762, 763, 764, 774, 775

[56] References Cited

U.S. PATENT DOCUMENTS

| | | |
|---|---|---|
| 3,844,831 | 10/1974 | Cass et al. . |
| 4,242,698 | 12/1980 | Ghate et al. . |
| 4,367,119 | 1/1983 | Logan et al. . |
| 4,386,116 | 5/1983 | Nair et al. . |
| 4,600,624 | 7/1986 | Joseph et al. . |
| 4,789,648 | 12/1988 | Chow et al. . |
| 4,792,534 | 12/1988 | Tsuji et al. . |
| 4,808,552 | 2/1989 | Anderson . |
| 4,944,836 | 7/1990 | Beyer et al. . |
| 4,948,755 | 8/1990 | Mo . |
| 4,956,313 | 9/1990 | Cote et al. . |
| 4,966,870 | 10/1990 | Barber et al. ............... 437/228 |
| 4,992,135 | 2/1991 | Doan . |

(List continued on next page.)

FOREIGN PATENT DOCUMENTS

| | | |
|---|---|---|
| 2211023 | 6/1989 | United Kingdom . |
| 2268329 | 1/1993 | United Kingdom . |

OTHER PUBLICATIONS

Chiang, C., et al., "Dielectric Barrier Study for Cu Metallization," *1994 Proceedings Eleventh International VLSI Multilevel Interconnection Conference (VMIC)*, Santa Clara, CA, pp. 414–420 (Jun. 7–8, 1994).

Kaufman, F.B., et al., "Chemical–Mechanical Polishing for Fabricating Patterned W Metal Features as Chip Interconnects," *J. Electrochem. Soc.*, vol. 138, No. 11, pp. 3460–3465 (Nov. 1991).

Kaanta, C.W., et al., "Dual Damascene: A ULSI Wiring Technology," VMIC Conference, pp. 144–152 (Jun. 11–12, 1991).

(List continued on next page.)

*Primary Examiner*—Edward Wojciechowicz
*Attorney, Agent, or Firm*—Blakely, Sokoloff, Taylor & Zafman

[57] ABSTRACT

A method for forming interconnections for semiconductor fabrication and semiconductor devices have such interconnections are described. A first patterned dielectric layer is formed over a semiconductor substrate and has a first opening filed with conductive material. Another patterned dielectric layer is formed over the first dielectric layer and has a second opening over at least a portion of the conductive material. The first patterned dielectric layer may serve as an etch-stop in patterning the other patterned dielectric layer. Also, a dielectric etch-stop layer may be formed over the first patterned dielectric layer and over the conductive material before the other patterned dielectric layer has been formed. This dielectric etch-stop layer may serve as an etch-stop in patterning the other patterned dielectric layer. The second opening exposes a portion of the dielectric etch-stop layer. The exposed portion of the dielectric etch-stop layer is removed. The second opening is filled with conductive material.

14 Claims, 11 Drawing Sheets

U.S. PATENT DOCUMENTS

| | | |
|---|---|---|
| 5,000,818 | 3/1991 | Thomas et al. |
| 5,010,039 | 4/1991 | Ku et al. |
| 5,055,908 | 10/1991 | Fuller et al. |
| 5,117,276 | 5/1992 | Thomas et al. |
| 5,122,859 | 6/1992 | Coleman, Jr. |
| 5,209,817 | 5/1993 | Ahmad et al. |
| 5,219,787 | 6/1993 | Carey et al. |
| 5,244,837 | 9/1993 | Dennison ............................ 437/195 |
| 5,277,985 | 1/1994 | Li et al. |
| 5,300,813 | 4/1994 | Joshi et al. |
| 5,308,796 | 5/1994 | Feldman et al. |
| 5,310,602 | 5/1994 | Li et al. |

OTHER PUBLICATIONS

Pai, P., et al., "Selective Electroless Copper for VLSI Interconnection," *IEEE Electron Device Letters*, vol. 10, No. 9, pp. 423–425 (Sep. 1989).

Gardner, D.S., et al., "Encapsulated Copper Interconnection Devices Using Sidewall Barriers," VMIC Conference, pp. 99–108 (Jun. 11–12, 1991).

Warnock, T., "A Two–Dimensional Process Model for Chemimechanical Polish Planarization," *J. Electrochem. Soc.*, vol. 138, No. 8, pp. 2398–2402 (Aug. 1991).

Hu, C–K., et al., "Copper–Polyimide Wiring Technology for VLSI Circuits," *Tungsten and Other Advanced Metals for VLSI/ULSI Applications V*, Materials Research Society, pp. 369–373 (1990), no month.

Gardner, D.S., et al., "Interconnection and Electromigration Scaling Theory," *IEEE Transactions on Electron Devices*, vol. ED–34, No. 3, pp. 633–643 (Mar. 1987).

"Process and Structure for Improved Electromigration Resistance," *IBM Technical Disclosure Bulletin*, vol. 32, No. 10B, pp. 112–113 (Mar. 1990).

"Lithographic Patterns with a Barrier Liner," *IBM Technical Disclosure Bulletin*, vol. 32, No. 10B, pp. 114–115 (Mar. 1990).

"High Stud–to–Line Contact Area in Damascene Metal Processing," *IBM Technical Disclosure Bulletin*, vol. 33, No. 1A, pp. 160–161 (Jun. 1990).

"Technique to Fabricate Co–Planar Conductors in a Dielectric Layer," *IBM Technical Disclosure Bulletin*, vol. 33, No. 2, pp. 258–259 (Jul. 1990).

"Damascene Electromigration Resistant Stud Contact," *IBM Technical Disclosure Bulletin*, vol. 33, No. 10A, pp. 312–313 (Mar. 1991).

"Copper Multilevel Interconnections," *IBM Technical Disclosure Bulletin*, vol. 33, No. 11, pp. 299–300 (Apr. 1991).

"End–Point Detection of Chemical/Mechanical Polishing of Thin Film Structures," *IBM Technical Disclosure Bulletin*, vol. 34, No. 4A, pp. 198–200 (Sep. 1991).

"End–Point Detection of Chemical/Mechanical Polishing of Circuitized Multilayer Substrates," *IBM Technical Disclosure Bulletin*, vol. 34, No. 4B, pp. 406–407 (Sep. 1991).

"Damascene Process for Simultaneously Inlaying Tungsten into Lines and Contacts," *IBM Technical Disclosure Bulletin*, vol. 34, No. 7A, pp. 1–2 (Dec. 1991).

"Multilevel Interconnection Structure," *IBM Technical Disclosure Bulletin*, vol. 34, No. 9, p. 220 (Feb. 1992).

"Diamond–Like Films as a Barrier to Chemical–Mechanical Polish," *IBM Technical Disclosure Bulletin*, vol. 35, No. 1B, pp. 211–213 (Jun. 1992).

"Selective Chemical–Mechanical Polishing Process for Removal of Copper," *IBM Technical Disclosure Bulletin*, vol. 36, No. 2, p. 171 (Feb. 1993).

"Electroless Plating Scheme to Hermetically Seal Copper Features," *IBM Technical Disclosure Bulletin*, vol. 36, No. 2, pp. 405–406 (Feb. 1993).

"Damascene: Optimized Etch Stop Structure and Method," *IBM Technical Disclosure Bulletin*, vol. 36, No. 11, p. 649 (Nov. 1993).

"Copper/Polyimide Structure with Selective Cu3Si/SiO2 Etch Stop," *IBM Technical Disclosure Bulletin*, vol. 37, No. 6A, p. 53 (Jun. 1994).

Arita, Y., et al., "Deep Submicrom Cu Planar Interconnection Technology Using Cu Selective Chemical Vapor Deposition," *IEDM Technical Digest*, International Electron Devices Meeting, Washington, D.C., pp. 893–895 (Dec. 3–6, 1989).

Hoshino, K., et al., High Temperature RIE of Copper Films, The Japan Society of Applied Physics, 36th Spring Meeting, Extended Abstracts, p. 570 (Mar. 1989) (English Summary).

Ohno, K., et al., "High Rate Reactive Ion Etching of Copper Films in SiC14, N2, C12 and NH3 Mixture," *Extended Abstracts of the 22nd (1990 International) Conference on Solid State Devices and Materials*, Sendai, Japan, pp. 215–218 (Aug. 22–24, 1990.).

Ohno, K., et al., "The Influence of NH3 Addition of Pressure on the Profile of RIE Copper Films," The Japan Society of Applied Physics, 38th Spring Meeting, Extended Abstracts, p. 500 (Mar. 1991) (English Summary).

Ohno, K., et al. "Reactive Ion Etching of Copper Films in SiC14 and N2 Mixture," *Japanese Journal of Applies Physics*, vol. 28, No. 6, pp. L 1070–L 1072 (Jun. 1989).

Rogers, B., et al., "Issues in a Submicron Cu Interconnect System Using Liftoff Patterning," *1991 Proceedings Eighth International IEEE VLSI Multilevel Interconnection Conference (VMIC)*, Santa Clara, California, pp. 137–143 (Jun. 11–12, 1991).

Swartz, G.C., et al., "Reactive Ion Etching of Copper Films," *Journal of the Electrochemical Society*, vol. 130, No. 8, pp. 1777–1779 (Aug. 1983).

J.J. Estabil, H.S. Rathore, & E.N. Levine, Electromigration Improvments With Titanium Underlay And Overlay In Al(Cu) Metallurgy, Jun. 11–12, 1991 VMIC Conference, pp. 242–248.

Eliot K. Broadbent, Janet M. Flanner, Wilbert G.M. Van Den Heok, & I–Wen Huang Connick, "High–Density High–Reliability Tungsten Interconnection By Filled Interconnect Groove Metallization", IEEE Transactions On Electron Devices, vol. 35, No. 7, Jul., 1988, pp. 952–956.

Gardner et al, "Encapsulated Copper Interconnection Devices Using Sidewall Barriers", VMIC Conf., pp99–108, Jun. 11–12, 1991.

Rogers et al, "Issues in a Submicron Cu Interconnect System Using Liftoff Paterning", 1991 IEEE VMIC,pp.137–143, Jun. 11–12, 1991.

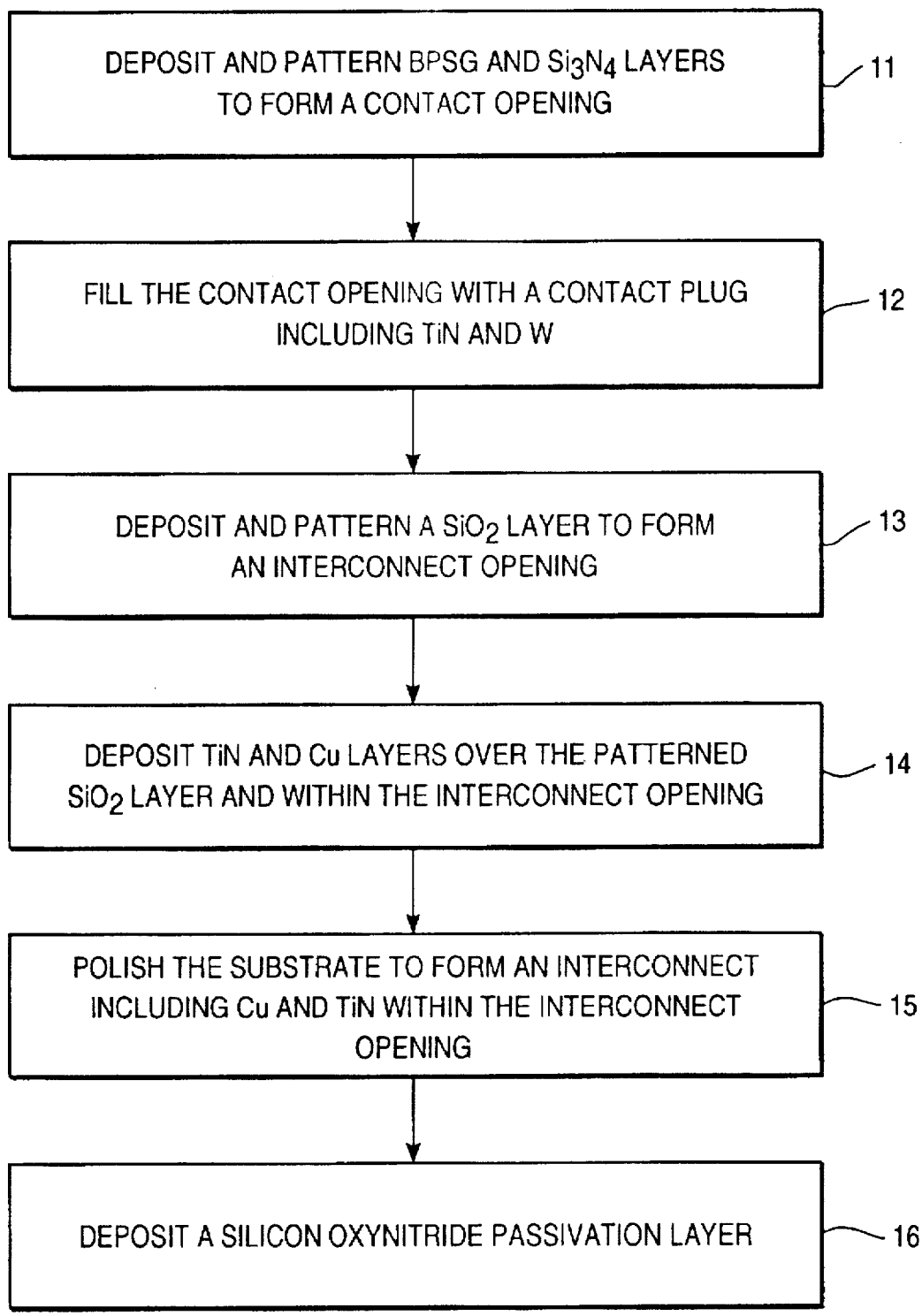
FIG_1

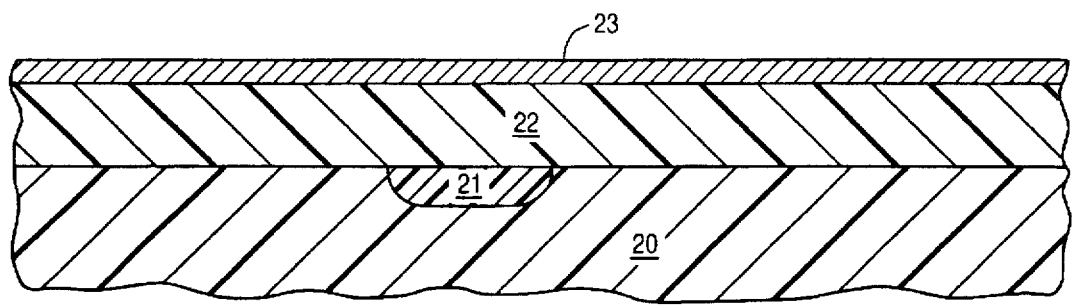
FIG_2
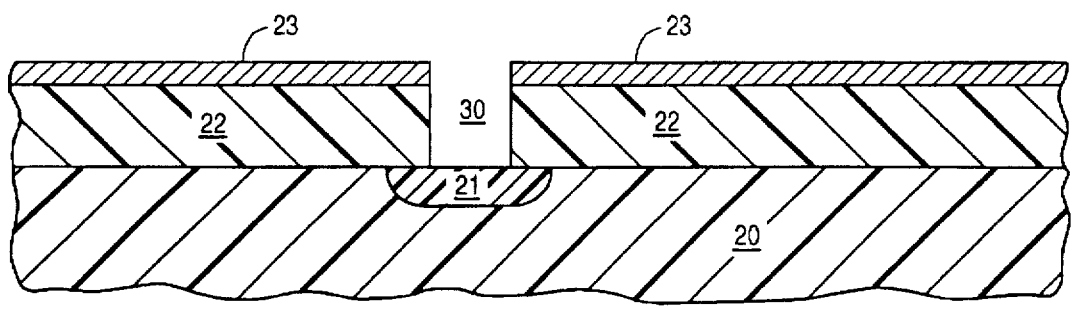
FIG_3
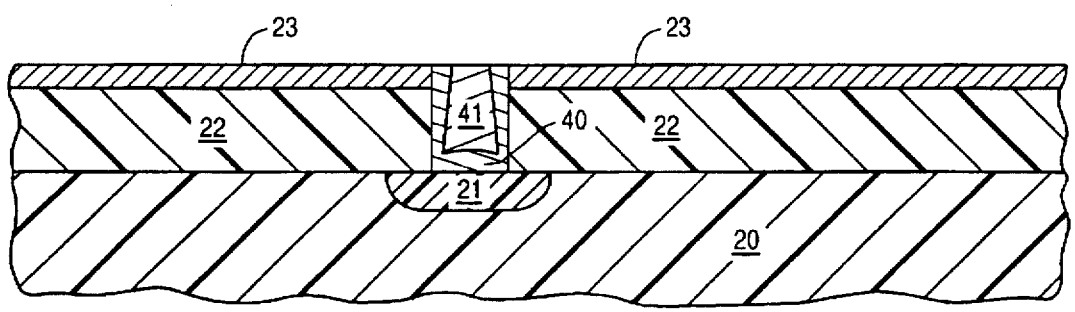
FIG_4

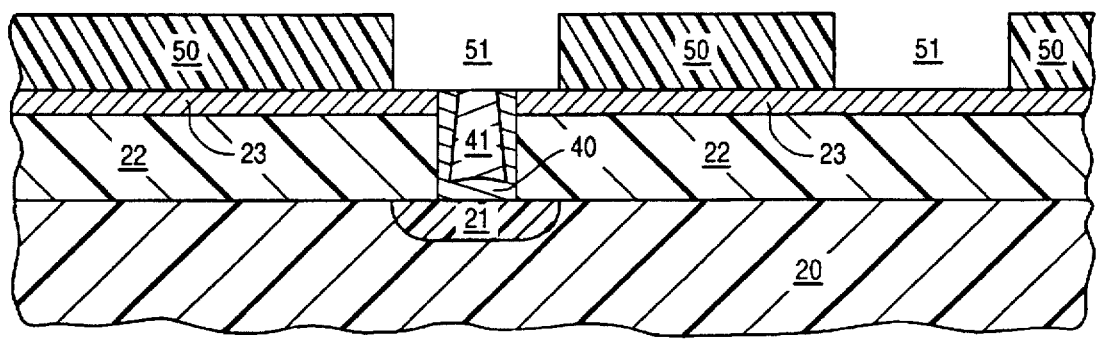
FIG_5
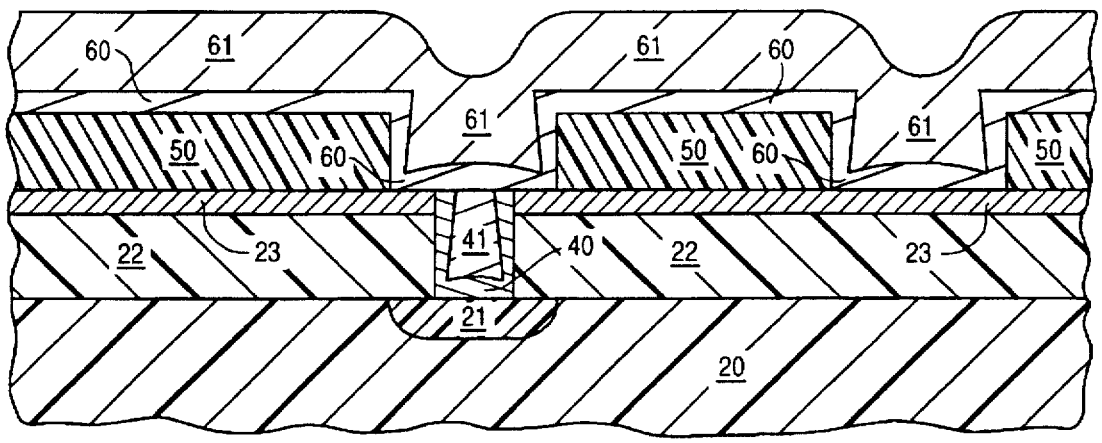
FIG_6
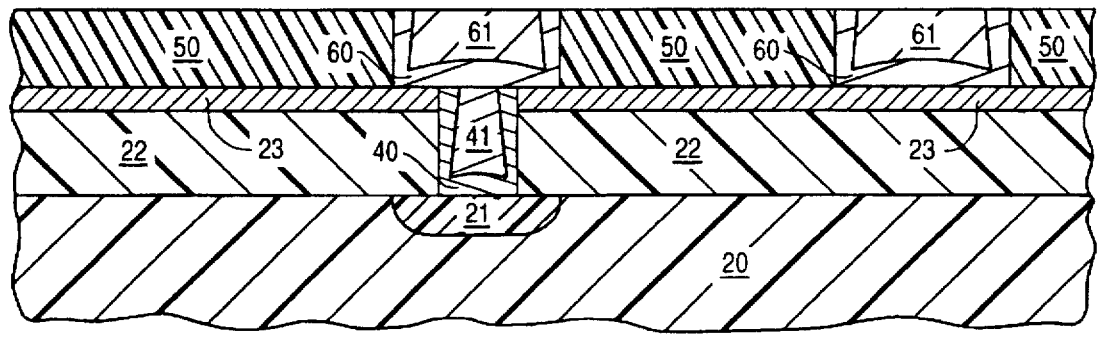
FIG_7

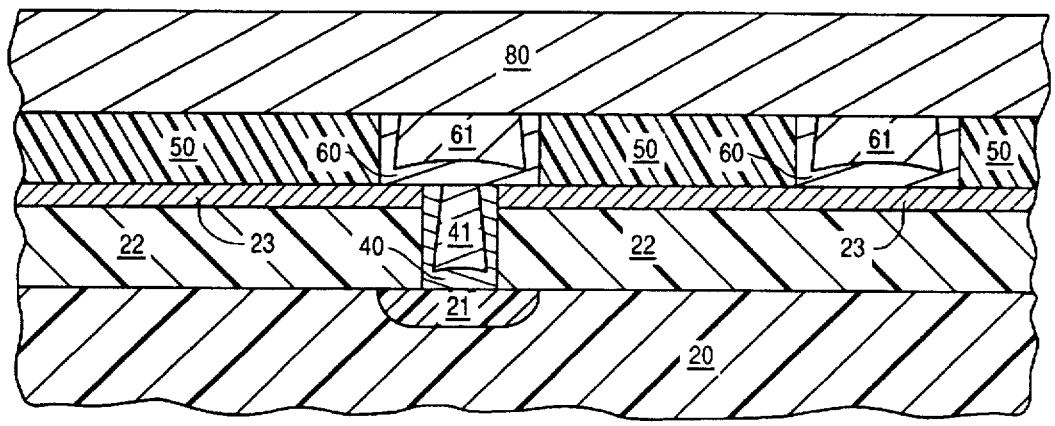
FIG_8
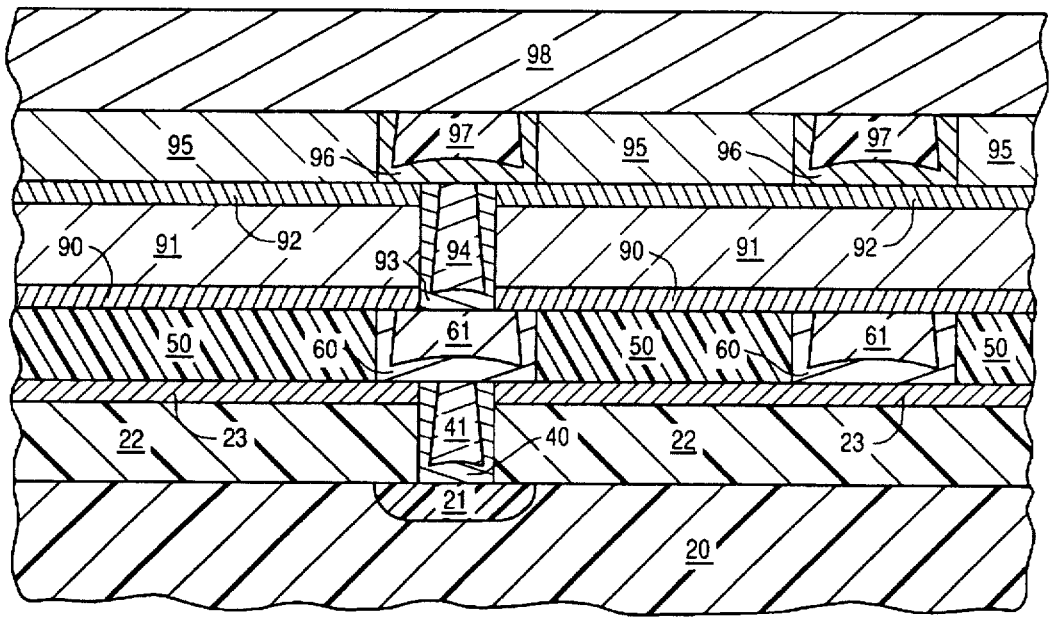
FIG_9
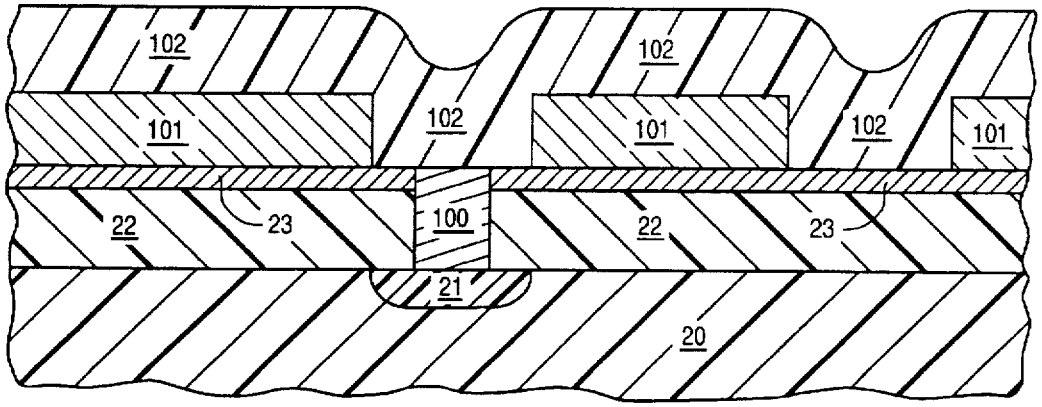
FIG_10

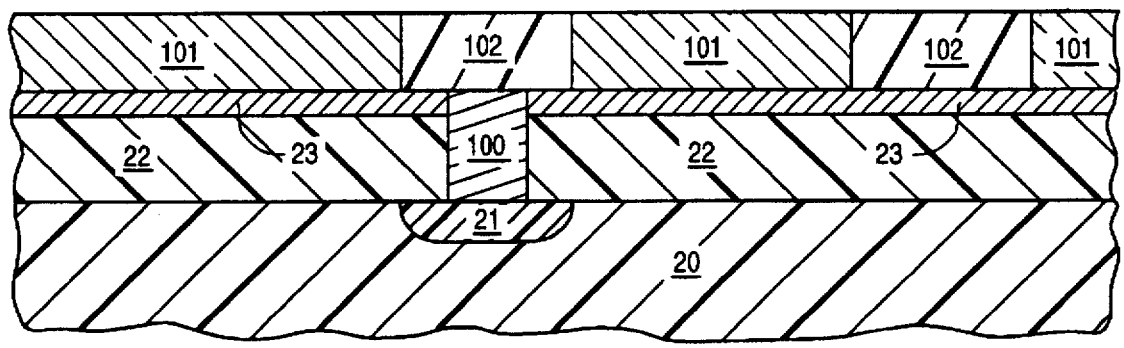
FIG_11
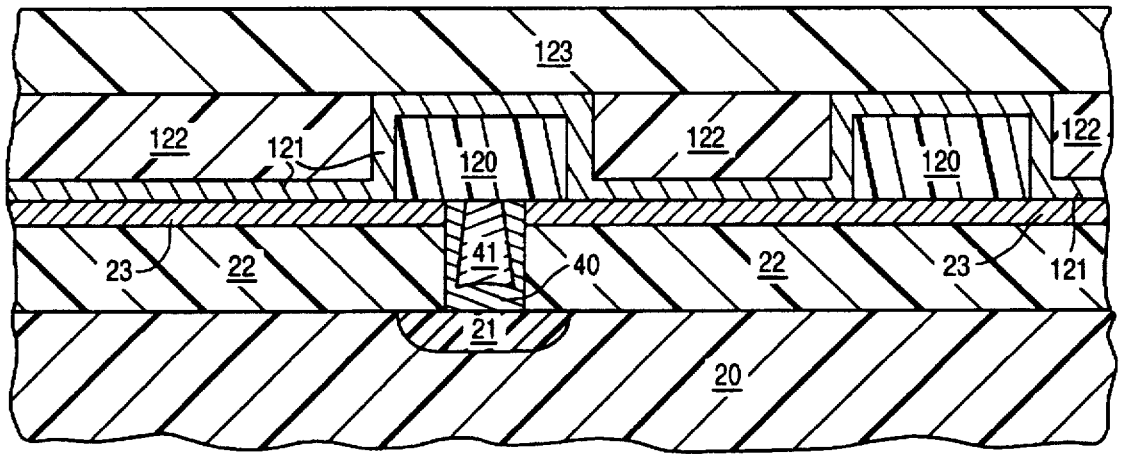
FIG_12
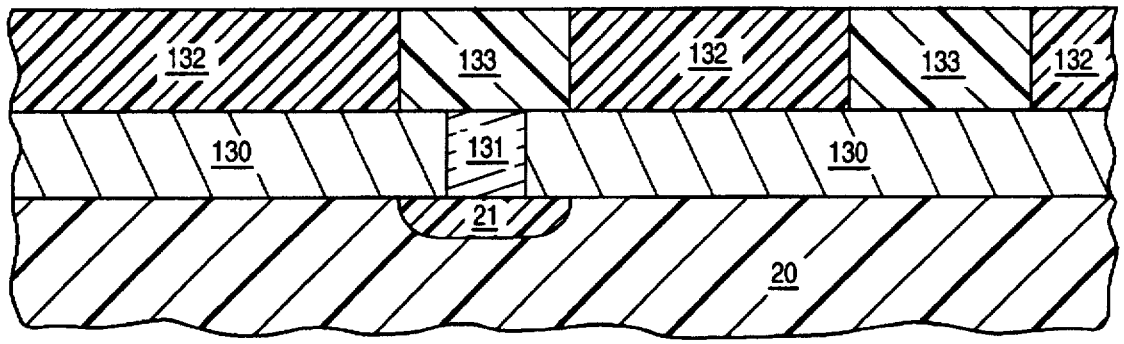
FIG_13

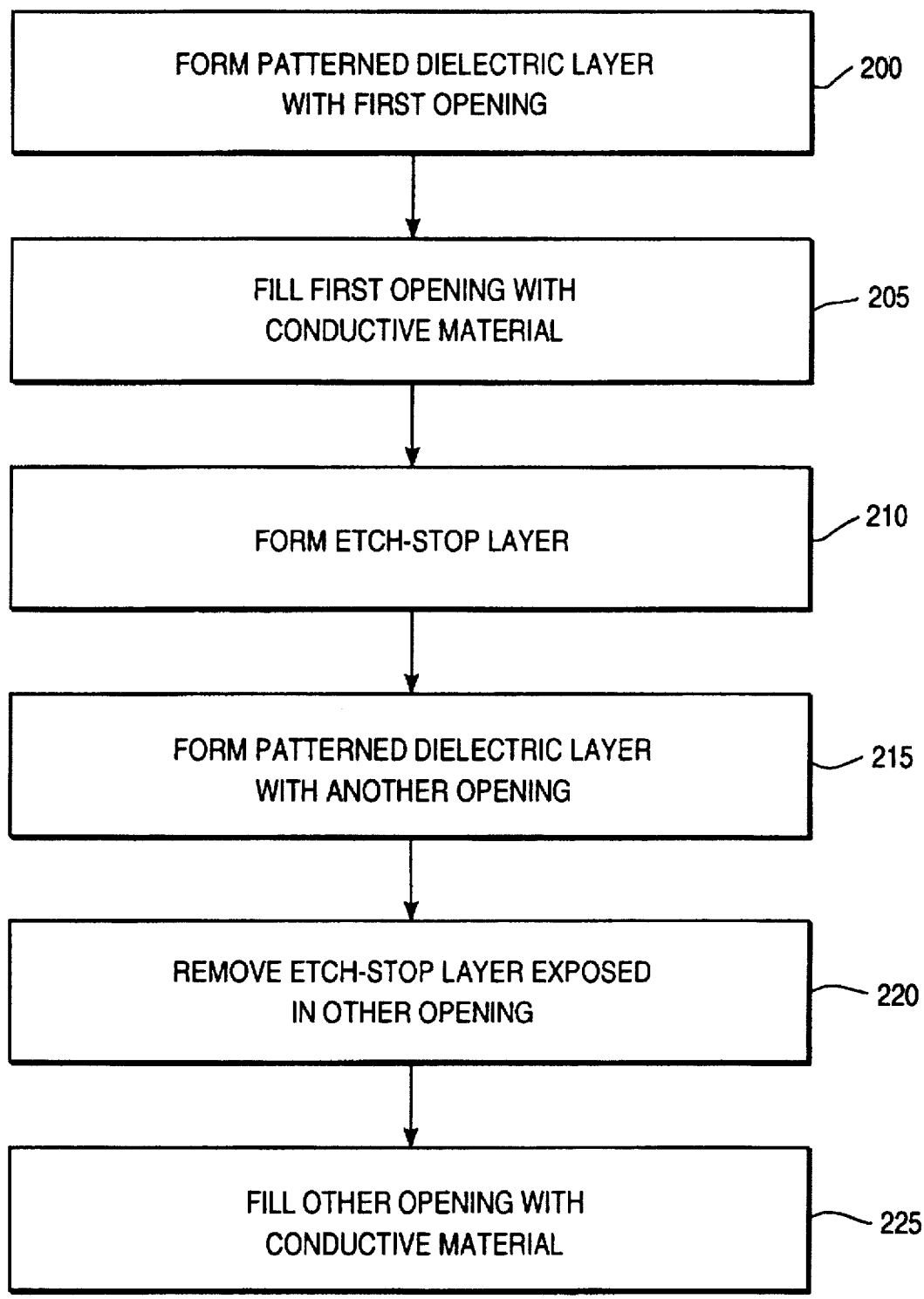
FIG_14

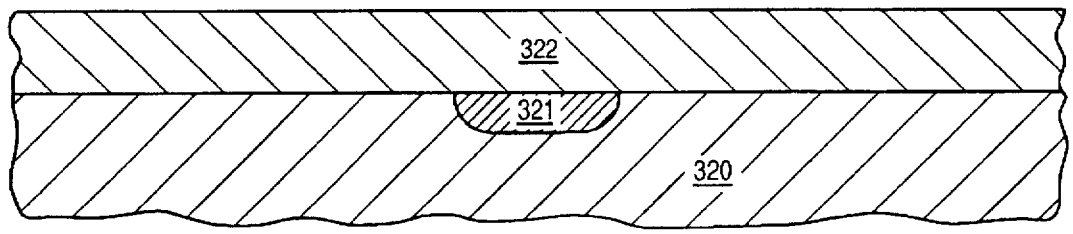
FIG_15
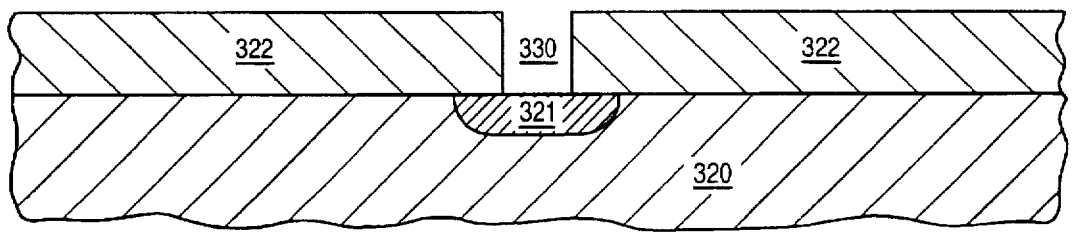
FIG_16
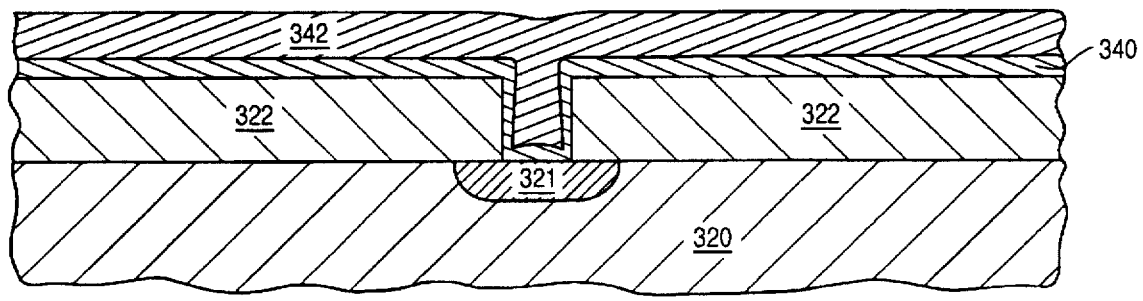
FIG_17

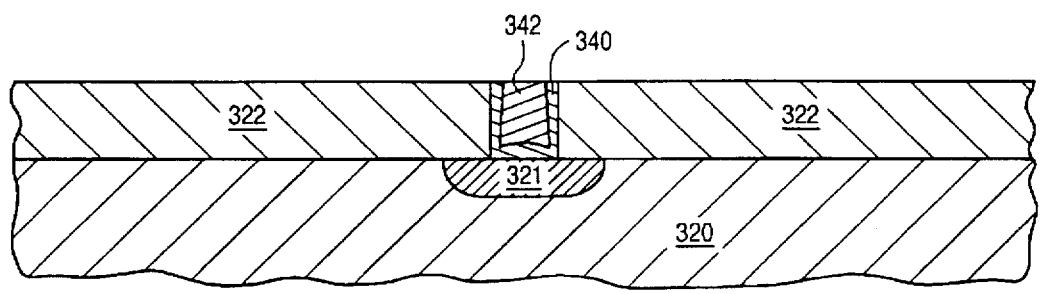
FIG_18
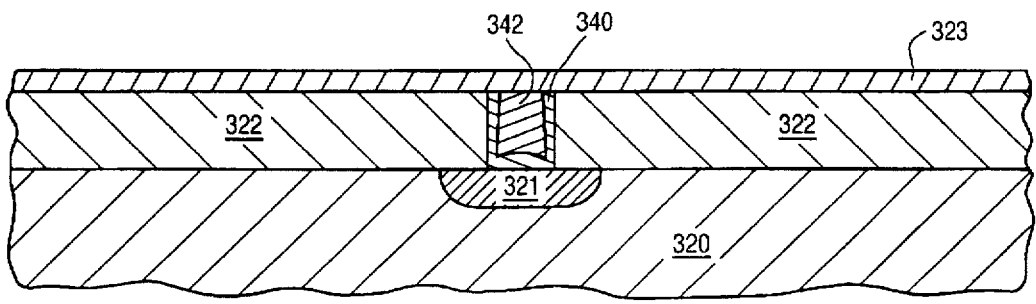
FIG_19
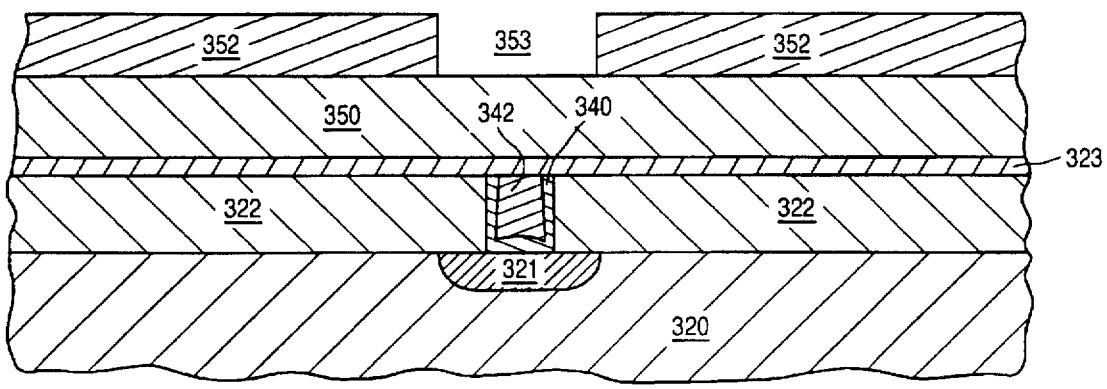
FIG_20

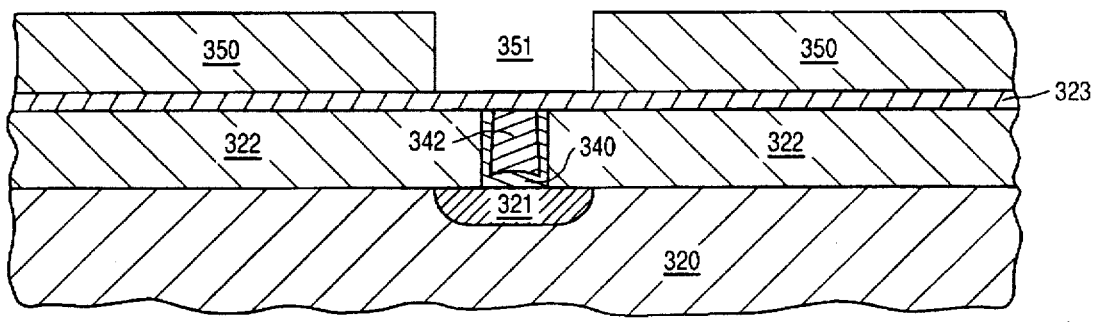
FIG_21
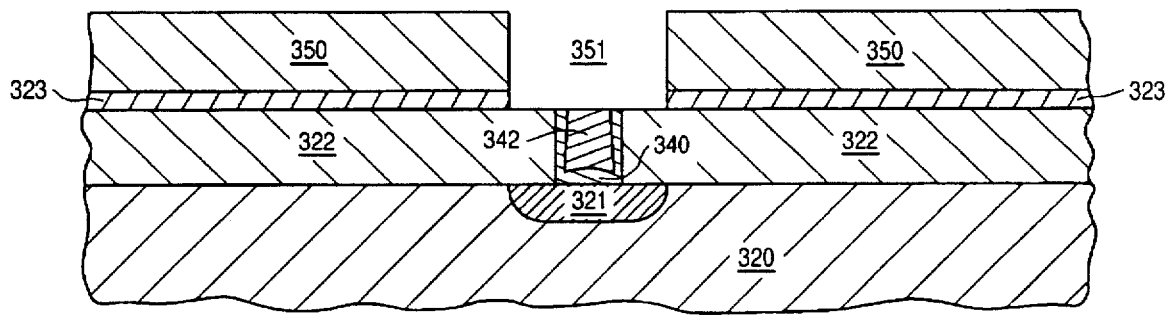
FIG_22

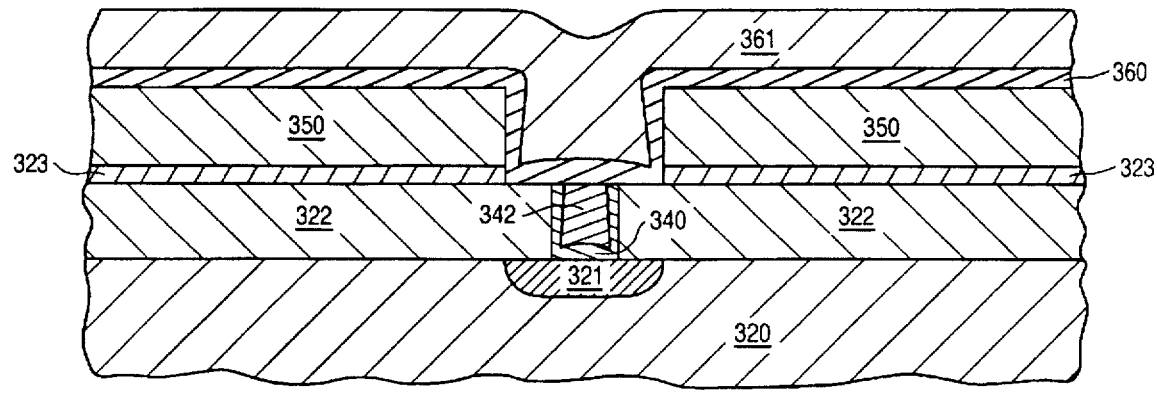
FIG_23
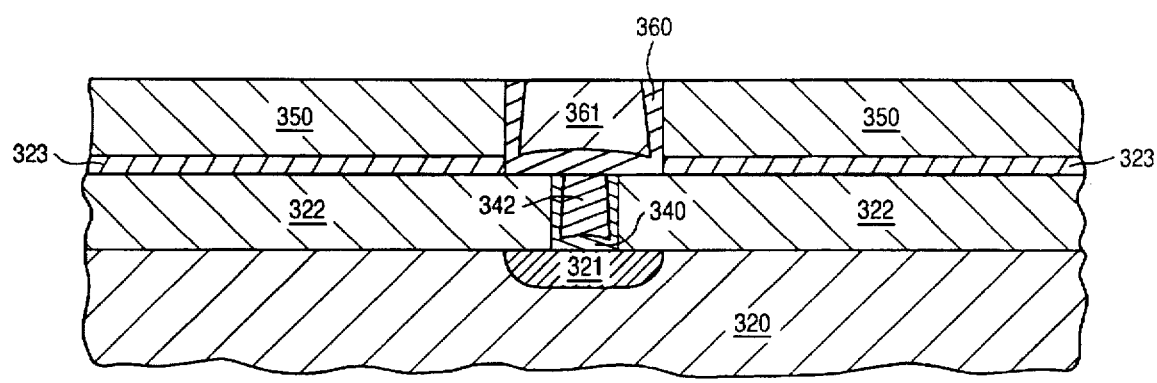
FIG_24

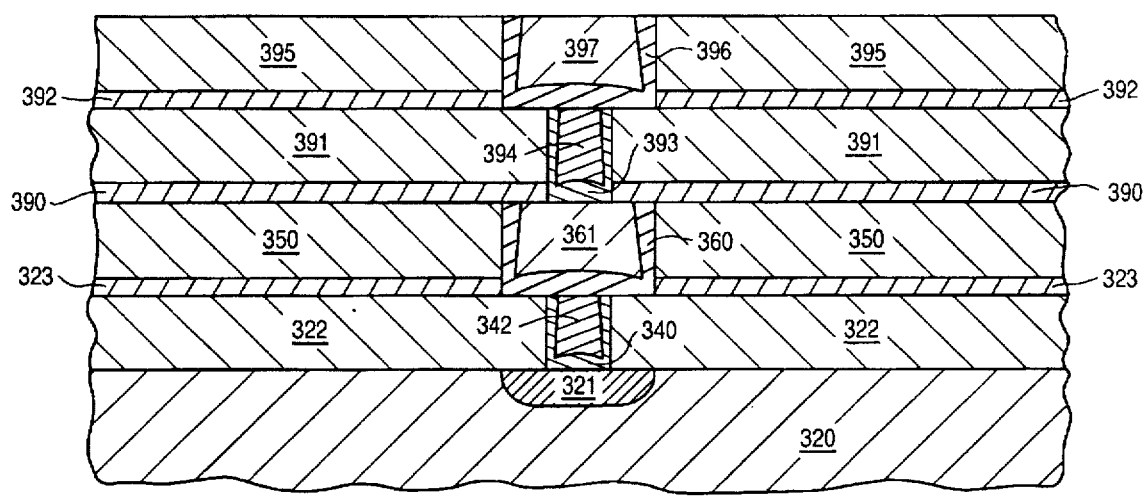
FIG_25

METHOD FOR FORMING INTERCONNECTIONS FOR SEMICONDUCTOR FABRICATION AND SEMICONDUCTOR DEVICE HAVING SUCH INTERCONNECTIONS

This is a continuation of application Ser. No. 08/430,759, filed Apr. 27, 1995, now abandoned, which is a division of application Ser. No. 08/314,248, filed Sep. 28, 1994, now abandoned, which is a continuation in part of application Ser. No. 07/905,473, filed Jun. 29, 1992, now U.S. Pat. No. 5,612,254.

FIELD OF THE INVENTION

The present invention relates to the field of semiconductor devices, and in particular, to the formation of interconnections for those devices.

BACKGROUND OF THE INVENTION

As devices are scaled to sub-micron dimensions, formation of reliable, sub-micron interconnections (interconnects) becomes increasingly important. Also important for sub-micron devices is the use of planarization technologies during interconnect and wiring formation, as well as other stages of device formation. Many current processes used to form interconnects are unable to form interconnects with a sub-micron width in production. These processes fail for one or more reasons as described below.

A common method of forming an interconnect includes the steps of: 1) forming a patterned dielectric layer having contact openings to at least one underlying layer; 2) depositing a metal layer over the patterned dielectric layer; 3) forming a patterned photoresist layer over the metal layer; 4) etching the metal layer to form the interconnect; and 5) removing the patterned photoresist layer. This method has several problems. First, the metal layer typically has poor step coverage that causes the metal to be thinner along the walls of the contact openings. The thin metal increases resistance and may break when the device is stressed, causing an open circuit. Second, there may be problems with etching. Wet chemical etchants etch isotropically and generally give insufficient dimensional control for sub-micron devices. Dry etching is typically used, but some metal layers, such as copper and gold, are difficult to plasma etch. Third, aluminum can be plasma etched, but it also has problems. The substrate is typically alloyed or subjected to at least one heat cycle after the aluminum has been deposited and patterned. The heat cycle may cause the aluminum to spike into the silicon substrate lying at the bottom of a contact opening. Also, aluminum can form hillocks during an alloy or other postmetalization heat cycles. The hillocks may protrude from the interconnect to make electrical connection between adjacent interconnects, thereby shorting the interconnects together. Fourth, even if the interconnects may be formed without any of the previous problems, a subsequent dielectric layer that covers the interconnects typically has step coverage problems between narrowly spaced interconnects or requires a planarization process sequence.

Selective Electroless Metal Deposition (SEMD) is a method capable of forming an interconnect with a sub-micron width. A dielectric layer is deposited and patterned to form a patterned dielectric layer having an interconnect channel. As used in this specification, an interconnect channel is a pattern within a dielectric layer, wherein part of the dielectric layer is etched away. The interconnect is subsequently formed within the interconnect channel. Before depositing the metal using SEMD, the surface upon which the metal is to be deposited typically needs a treatment within the interconnect channel, so that metal deposits within the interconnect channel but not on the patterned dielectric layer. A common technique for treating the surface includes very heavily doping the interconnect channel with silicon ions at a dose of at least $1 \times 10^{16}$ ions/cm$^2$. Another treatment method includes contacting the surface with an activating solution. Surface treatments typically involve at least one additional processing step and may cause processing complications. Surface treatments may not be completely effective, such that metal does not properly deposit within the interconnect channel. In addition, particles and other foreign materials may lie on the dielectric layer and act as nucleating sites during the metal deposition. Therefore, metal particles are typically formed on the patterned dielectric layer. The metal particles may cause electrical shorts or other defects within the device. The inconsistent effectiveness and complications of the surface treatments steps and the formation of metal particles have prevented the SEMD method from being used in a production mode.

Dual damascene is another method of forming interconnects within interconnect channels. A single dielectric layer is deposited and patterned using a two-step etch process. The first step etches most of the dielectric layer within contact openings and the second step etches the interconnect channels and the rest of the dielectric layer within the contact openings. The depth of the interconnect channels are difficult to control because of film deposition and etch nonuniformities. The interconnect channels may be too deep in the center of the wafer and too shallow near the edge of the same wafer, resulting in large variations of interconnect resistance across the wafer. Metal deposition is complicated because the contact openings may have an aspect ratio of 2:1, 3:1, or more. The high aspect ratio makes sputter depositions virtually impossible. A metal layer may be deposited by chemical vapor deposition within the contact openings and interconnect channels. However, widely used interconnect materials such as aluminum, copper, gold, and silver are not typically deposited by chemical vapor deposition in production. Polysilicon and tungsten may be deposited by chemical vapor deposition, but these materials have higher resistivities compared to aluminum, copper, gold, and silver and are not generally used as interconnect materials. The SEMD method may be used but has the previously discussed problems. In addition, the SEMD method may form a metal void if metal deposited within the interconnect channels seal off their underlying contact openings before the contact openings are filled.

Copper is typically not used as an interconnect material. Although copper has a relatively low cost and low resistivity, it has a relatively large diffusion coefficient into silicon dioxide and silicon. Copper from an interconnect may diffuse into the silicon dioxide layer causing the dielectric to be conductive and decreasing the dielectric strength of the silicon dioxide layer. Copper interconnects should be encapsulated by at least one diffusion barrier to prevent diffusion into the silicon dioxide layer. Silicon nitride is a diffusion barrier to copper, but the prior art teaches that the interconnects should not lie on a silicon nitride layer because it has a high dielectric constant compared to silicon dioxide. The high dielectric constant causes an undesired increase in capacitance between the interconnect and other interconnects and the substrate.

SUMMARY AND OBJECTS OF THE INVENTION

The embodiments of the present invention form an interconnect channel and an interconnect within a semiconductor device. In general, a first dielectric layer is deposited over a substrate and patterned to form a contact or via opening that is filled to form a contact or via plug. A second dielectric layer is deposited over the patterned first dielectric layer and the contact or via plug and is selectively etched to form an interconnect channel in the second dielectric layer. The first or second dielectric layers may comprise more than one individual dielectric layer. Preferably, the first dielectric layer acts as an etch stop when the second dielectric layer is selectively etched to form the interconnect channel. An interconnect layer is deposited over the second dielectric layer and within the interconnect channel. The substrate is polished with a polishing solution to remove that portion of the interconnect layer that, lies on the second dielectric layer to form an interconnect within the interconnect channel. The interconnect layer may include a barrier layer and a metal layer. Additional interconnect levels may be formed in a similar manner. If needed, a diffusion barrier layer may be deposited before forming another interconnect level. A passivation layer is deposited over the uppermost interconnect level.

The embodiments have numerous benefits over prior art methods. The depth of the interconnect channels is easier to control because the first dielectric layer acts as an etch stop when selectively etching the second dielectric layer. A longer overetch during interconnect channel formation may be used without significantly etching the first dielectric layer. A copper interconnect may be formed, which may be thinner than an aluminum interconnect while giving the same or lower resistance. The polishing step forms a substantially planar substrate surface. Therefore, additional steps required for planarization schemes are not needed. One embodiment includes an encapsulated metal layer to provide more flexibility when selecting dielectric, metal, and plug materials.

A method for use in fabricating a semiconductor device using a semiconductor substrate is also described. A first patterned dielectric layer is formed over the semiconductor substrate. The first patterned dielectric layer has a first dielectric material and has a first opening. The first opening is filled with first conductive material. A second dielectric layer is formed over the first patterned dielectric layer and over the first conductive material. The second dielectric layer has a second dielectric material. A third patterned dielectric layer is formed over the second dielectric layer. The third patterned dielectric layer has a third dielectric material and has a second opening over at least a portion of the first conductive material. The second opening exposes a portion of the second dielectric layer. The exposed portion of the second dielectric layer is removed. The second opening is filled with second conductive material.

A semiconductor device is also described. The semiconductor device includes a semiconductor substrate and a first patterned dielectric layer formed over the semiconductor substrate. The first patterned dielectric layer has a first dielectric material and has a first opening filled with first conductive material. The device also includes a second patterned dielectric layer formed over the first patterned dielectric layer. The second patterned dielectric layer has a second dielectric material and has a second opening. The device further includes a third patterned dielectric layer formed over the second patterned dielectric layer. The third patterned dielectric layer has a third dielectric material and has a third opening over the second opening and over at least a portion of the first conductive material. The third opening is approximately equal in width to the second opening. The second opening and the third opening are filled with second conductive material over at least a portion of the first conductive material.

Other objects, features, and advantages of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements and in which:

FIG. 1 shows a flow diagram of a currently preferred embodiment.

FIG. 2 shows a cross-sectional view of a substrate including a monocrystalline silicon layer and a doped region, a borophosphosilicate glass layer, and a silicon nitride layer.

FIG. 3 shows the substrate of FIG. 2 after a contact opening within the borophosphosilicate glass and silicon nitride layers has been formed.

FIG. 4 shows the substrate of FIG. 3 after the contact opening has been filled with a contact plug.

FIG. 5 shows the substrate of FIG. 4 after a patterned silicon dioxide layer having interconnect channels has been formed over the patterned silicon nitride layer in accordance with a currently preferred embodiment.

FIG. 6 shows the substrate of FIG. 5 after a titanium nitride layer and a copper layer have been deposited over the patterned silicon dioxide layer and within the interconnect channels.

FIG. 7 shows the substrate of FIG. 6 after chemical mechanical polishing with a polishing solution in accordance with a currently preferred embodiment.

FIG. 8 shows the substrate of FIG. 7 after a silicon oxynitride passivation layer have been deposited over the patterned silicon dioxide layer and the interconnects.

FIG. 9 shows the substrate in FIG. 7 after forming a second interconnect level including a via and depositing a silicon oxynitride passivation layer.

FIG. 10 shows an alternate embodiment having a tungsten contact plug and an aluminum interconnect layer.

FIG. 11 shows the substrate in FIG. 10 after chemical mechanical polishing to form interconnects within the interconnect channels in accordance with an alternate embodiment.

FIG. 12 shows an alternate embodiment having encapsulated copper interconnects.

FIG. 13 shows a substrate having a tungsten contact plug and gold interconnects in accordance with an alternate embodiment.

FIG. 14 illustrates, in flow diagram form, one method for use in fabricating a semiconductor device.

FIG. 15 illustrates for one embodiment a cross-sectional view of a semiconductor substrate having a diffusion region and a dielectric layer.

FIG. 16 illustrates a cross-sectional view of the semiconductor substrate of FIG. 15 after the dielectric layer has been patterned to define a contact opening.

FIG. 17 illustrates a cross-sectional view of the semiconductor substrate of FIG. 16 after a conductive layer has been formed over the substrate to fill the contact opening.

FIG. 18 illustrates a cross-sectional view of the semiconductor substrate of FIG. 17 after the conductive layer overlying the dielectric layer has been removed.

FIG. 19 illustrates a cross-sectional view of the semiconductor substrate of FIG. 18 after an etch-stop layer has been formed over the substrate.

FIG. 20 illustrates a cross-sectional view of the semiconductor substrate of FIG. 19 after a dielectric layer and a patterned mask layer have been formed over the substrate to define an interconnect channel.

FIG. 21 illustrates a cross-sectional view of the semiconductor substrate of FIG. 20 after the dielectric layer has been patterned to define the interconnect channel.

FIG. 22 illustrates a cross-sectional view of the semiconductor substrate of FIG. 21 after the etch-stop layer exposed in the interconnect channel has been removed.

FIG. 23 illustrates a cross-sectional view of the semiconductor substrate of FIG. 22 after a conductive layer has been formed over the substrate to fill the interconnect channel.

FIG. 24 illustrates a cross-sectional view of the semiconductor substrate of FIG. 23 after the conductive layer overlying the dielectric layer has been removed.

FIG. 25 illustrates for one embodiment the semiconductor substrate of FIG. 24 after a via layer and another interconnect layer have been formed over the substrate.

DETAILED DESCRIPTION

The following detailed description sets forth a specific embodiment or embodiments in accordance with the present invention for a method for forming interconnections for semiconductor fabrication and a semiconductor device having such interconnections. In the following description, details are set forth such as specific materials, thicknesses, process steps, etc., in order to provide a thorough understanding of the present invention. It will be evident, however, that the present invention may be practiced without these details. In other instances, specific processing techniques and parameters, equipment, etc., have not been described in particular detail so as not to obscure the present invention.

The embodiments of the present invention form an interconnect channel and an interconnect within a semiconductor device. In general, a first dielectric layer is deposited over a substrate and patterned to form a contact or via opening that is filled to form a contact or via plug. A second dielectric layer is deposited over the patterned first dielectric layer and the contact or via plug and selectively etched to form an interconnect channel. The first or second dielectric layers may comprise more than one individual dielectric layers. Preferably, the first dielectric layer acts as an etch stop when the second dielectric layer is selectively etched to form the interconnect channel. An interconnect layer is deposited over the patterned dielectric layer and within the interconnect channel. The substrate is polished with a polishing slurry to remove that portion of the interconnect layer that lies on the patterned second dielectric layer to form an interconnect within the interconnect channel. The interconnect layer may include a barrier layer and a metal layer. Additional interconnect levels may be formed in a similar manner. If needed, a diffusion barrier layer may be deposited before forming another interconnect level. A passivation layer is deposited over the uppermost interconnect level.

For other embodiments, a first patterned dielectric layer is formed over a semiconductor substrate. The first patterned dielectric layer has a first dielectric material, that may include silicon dioxide ($SiO_2$) for example, and has a first opening. The first opening is filled with first conductive material. The first opening may be filled a barrier layer, that may include titanium nitride for example, and with a conductive layer, that may include copper for example, such that the conductive layer is separated by the barrier layer from the first dielectric material of the first patterned dielectric layer. The barrier layer may be formed over the first patterned dielectric layer and within the first opening. The conductive layer may be formed over the barrier layer and within the first opening. A portion of the barrier layer and a portion of the conductive layer may be removed from the surface of the first patterned dielectric layer, for example by polishing the conductive layer and the barrier layer. A second dielectric layer is formed over the first patterned dielectric layer and over the first conductive material. The second dielectric layer has a second dielectric material that may include barrier material for the conductive layer, for example. The second dielectric material may include silicon nitride (SiN), for example. A third patterned dielectric layer is formed over the second dielectric layer. The third patterned dielectric layer has a third dielectric material, that may include silicon dioxide ($SiO_2$) for example, and has a second opening over at least a portion of the first conductive material. The second opening may be greater or less in width than the first opening. The third patterned dielectric layer may be formed by forming over the second dielectric layer a third dielectric layer having the third dielectric material, forming a patterned mask layer over the third dielectric layer, and etching, in accordance with the patterned mask layer, the third dielectric material from the third dielectric layer at a rate greater than that for etching the second dielectric material in the second dielectric layer to form the third patterned dielectric layer having the second opening. The patterned mask layer may be removed after the third patterned dielectric layer has been formed. The patterned mask layer may include photoresist, for example. The second opening exposes a portion of the second dielectric layer. The exposed portion of the second dielectric layer is removed, for example by etching the second dielectric material from the exposed portion of the second dielectric layer at a rate greater than that for etching the third dielectric material in the third patterned dielectric layer. The exposed portion of the second dielectric layer may be removed after the patterned mask layer has been removed. The second opening is filled with second conductive material. The second opening may be filled with a second barrier layer and with a second conductive layer such that the second conductive layer is separated by the second barrier layer from the third dielectric material of the third patterned dielectric layer.

A number of materials may be used with the present invention. In general, the dielectric layers comprise one or more layers of silicon nitride, silicon dioxide (doped or undoped), silicon oxynitride, fluoropolymer, parylene or polyimide. The interconnect and metal layers may include aluminum, aluminum alloys (including, for example, Al—Cu, Al.CU—Ti, Al—Sc), copper, gold, silver, tungsten, or molybdenum; the barrier layer may include tungsten, tantalum, titanium nitride, niobium, or molybdenum; the contact plug may include tungsten, tantalum, titanium nitride, molybdenum, polysilicon, or a silicide (including for example, $TiSi_x$, $WSi_x$, $NiSi_x$, $MoSi_x$, $TaSi_x$, $PdSi_x$, $CoSi_x$, and others); and the diffusion barrier layer may include silicon nitride, phosphosilicate glass (PSG), silicon oxynitride, aluminum, aluminum oxide ($Al_xO_y$), tantalum, titanium nitride, niobium, or molybdenum. These materials are preferably deposited by chemical vapor deposition (CVD), or they can be deposited by sputter deposition.

The selection of materials depends on a number of factors. A contact or via opening may be deep relative to its width and should be at least partially filled with a material that is deposited by chemical vapor deposition. Therefore, the contact or via plugs may include tungsten or heavily doped polysilicon since these materials can easily be deposited by chemical vapor deposition. The first and second dielectric layers typically include different materials, so that the first dielectric layer acts as an etch stop when patterning the second dielectric layer to form the interconnect channel. If the metal layer significantly diffuses into a dielectric layer, the metal layer must be encapsulated by diffusion barriers. One material that is a diffusion barrier against one metal may not be a diffusion barrier for another metal. The embodiments described include various dielectric, diffusion barrier, and metal combinations. Every possible combination of dielectric, diffusion barrier, and metal is not included in this specification due to the large number of possible combinations. Tests may be conducted to determine diffusivities and interactions of metals with silicon, dielectric layers, or refractory metals. The materials to be tested are formed on a substrate and subjected to the highest temperature cycle to which the material will be exposed. Diffusivities and interactions may be determined by methods including Auger analysis, SIMS analysis, voltage-capacitance measurements, current-voltage measurements etc., for example. If the diffusivities and interactions are acceptable, the materials may be used as the dielectric, diffusion barrier, or metal materials when forming the interconnects.

The embodiments may be used to make electrical contact to device structures including polysilicon gates, word lines, source regions, drain regions, bit lines, bases, emitters, collectors, etc. Although the present invention is illustrated in conjunction with making electrical contact to an $N^+$ region in a silicon layer, it will be obvious to one skilled in the art that the present invention can be used with any semiconductor technology including NMOS, FMOS, CMOS, BiCMOS, bipolar, multi-chip modules (MCM) and III-VI semiconductors.

FIG. 1 includes a flow diagram of the current preferred embodiment of the present invention. In general, borophosphosilicate glass (BPSG) and silicon nitride layers are deposited and patterned to form with a contact opening that is filled with a contact plug including titanium nitride and tungsten. Next, a silicon dioxide layer is deposited and patterned to form an interconnect channel. Titanium nitride and copper layers are deposited over the patterned dielectric layer and within the interconnect channel. The substrate is then chemically mechanically polished to remove that portion of the titanium nitride and copper layers that lie on the patterned silicon dioxide layer. After the polishing step, additional interconnect levels may be formed over the substrate in a similar manner. A silicon oxynitride passivation layer is deposited over the substrate after the last interconnect layer is formed.

The patterning of the interconnect channels described below can be performed by any one of several well known method. For line widths in the deep submicron range (approximately 0.5µ and less), E-beam, X-ray, or deep UV lithography may be used, for example. In the present invention, deep UV lithography on a stepper system has been utilized to produce reliably channels having a width of approximately 0.4µ.

In a currently preferred embodiment, an interconnect makes electrical contact to an $N^+$ region within a semiconductor substrate. FIG. 2 includes the substrate having a monocrystalline silicon layer 20 and an $N^+$ region 21. A borophosphosilicate glass (BPSG) layer 22 is deposited over the substrate. The BPSG layer includes silicon dioxide, about 4 weight % boron, and 4 weight % phosphorus and is deposited to a thickness of about 8000 Å. The thickness of the BPSG layer 22 can be in the range of approximately 5000 to 10,000 Å, and the boron and phosphorus content can vary depending on the characteristics that are desired for the BPSG layer 22 including sodium ion gettering and flow characteristics of the glass layer. The BPSG layer 22 is subjected to a thermal cycle to densify or reflow the BFSG layer 22. The conditions for the thermal cycle are well known in the art. A silicon nitride layer 23 about 1000 Å thick is deposited over the BPSG layer 22. The silicon nitride layer 23, is relatively thin compared to the BPSG layer 22 but is thick enough to act as an etch stop during a subsequent etch step. The silicon nitride layer should be about 500 Å to 1500 Å thick. In a preferred embodiment, BPSG layer 22 and silicon nitride layer 23 make up the first dielectric layer.

The substrate is coated with a photoresist layer which is exposed and developed to form a patterned photoresist layer having openings over regions to be contacted such as region 21 (not shown). The silicon nitride and BPSG layers exposed by the opening in the photoresist layer are then etched by well-known methods. The photoresist layer is removed leaving a patterned first dielectric layer having a contact opening 30 about 0.5 µm wide extending to the $N^+$ region 21 as shown in FIG. 3. Next, a titanium nitride layer 40 about 1200 Å thick is deposited over the patterned first dielectric layer and within the contact opening. The titanium nitride layer 40 is typically deposited to a thickness between 500 Å and 1500 Å. A tungsten layer 41 is chemically deposited to a thickness about 5000 Å. The tungsten layer 41 must be at least thick enough such that the combination of the titanium nitride layer 40 and the tungsten layer 41 completely fills the contact opening 30. The substrate is anisotropically etched to form a contact plug, which includes the titanium nitride layer 40 and the tungsten layer 41 as shown in FIG. 4. In an alternate embodiment, the contact plug may comprise of tungsten, heavily doped polysilicon, or a silicide as long as 1) the tungsten, heavily doped polysilicon, or silicide is a diffusion barrier to a subsequently deposited metal layer or 2) a barrier layer is deposited over the tungsten, the heavily doped polysilicon, or the silicide before depositing a metal layer.

Next, a silicon dioxide layer is deposited to a thickness of approximately 6000 Å. A photoresist layer is coated over the silicon dioxide layer and patterned to form a patterned photoresist layer having an interconnect channel pattern (not shown). The silicon dioxide layer exposed by the patterned photoresist layer is etched using reactive ion etching (FIE) in a preferred embodiment to form interconnect channels 51. The FIE gas chemistry can be chosen by one skilled in the art such that silicon nitride, titanium nitride, and tungsten etch at a slower rate than silicon dioxide. Therefore, silicon nitride layer 23 acts as an etch stop during the interconnect channel etch step. The patterned photoresist layer is removed leaving a patterned silicon dioxide layer 50 having interconnect channels 51 each about 0.1 µm wide or greater extending to the silicon nitride layer 23 or the contact plug as shown in FIG. 5. After forming the interconnect channels 51, a titanium nitride barrier layer 60 is deposited to a thickness of about 1200 Å over the patterned silicon dioxide layer 50 and within the interconnect channels 51. The barrier layer 60 needs to be thick enough to act as a diffusion barrier for a subsequently deposited copper layer and is deposited to a thickness between approximately 500 Å to 1500 Å. A copper metal layer 61 is deposited to a thickness of about 6000 Å over the barrier layer 60, as shown in FIG. 6. The metal layer thickness may be varied as long as the interconnect channels 51 are filled by the barrier layer 60 and the sub-metal layer 61. There is no upper limit on the thickness of the metal layer 61, but a thicker metal layer 61 makes a subsequent metal polishing step longer and is generally not desired.

The substrate is chemically mechanically polished with a polishing solution to remove that portion of the barrier layer 60 and the metal layer 61 that lie on the patterned dielectric layer to form interconnects within the interconnect channels 51 as shown in FIG. 7. The polishing is done using a chemical mechanical polisher, such as the Westech 372™ polisher or similar polishers made by Strasbaugh, Cybeq, and Speedfam. The polishing solution in a preferred embodiment comprises approximately 10% by weight colloidal silica having a particle size of about 0.3 µm and about 5% by weight ammonium hydroxide. The polishing solution in a preferred embodiment has a pH of about 10.5, but may be in the range of approximately 9 to 13.

The polishing pad preferably is a polyurethane-based pad and may include plastic microballoons. The polishing pads may include the SUBA family of woven felt pads made by Rodel. The polishing pressure preferably is about 4 psi, although pressures as high as 14 psi may be used. The platen and carrier each preferably rotate at about 35 rpm, but either can be varied from 0 to 100 rpm. Using a preferred embodiment, the removal rate of the metal layer should be about 1200 Å/minute.

Formulations other than those given above may be used for the polishing solution. For example, alumina may be used instead of silica. The solution does not require any solids, but if solids are included, the solids should not make up more than 10 weight % of the solution. The particle size may vary from 0.05 µm to 1.0 µm. Smaller particles generally give better selectivity and etch at a slower rate, and larger particles generally have worse selectivity and etch at a faster rate. Additions other than ammonium hydroxide can be added to react with and dissolve the metal being polished. For example, prior art neutral or acidic solutions (pH less that 7) may be used to polish copper or other metals.

FIG. 7 illustrates one interconnect making electrical connection with the N$^+$ region 21 and the other interconnect making electrical contact to other portions of the substrate (not shown). The interconnect lies on the patterned silicon nitride layer and the contact plug. Contrary to the prior art, the interconnects may lie on silicon nitride without a significant decrease in device performance if the silicon nitride layer is not too thick (no greater than about 1500 Å). A silicon oxynitride passivation layer 80 is, deposited over the substrate as shown in FIG. 8.

The present invention has numerous benefits over prior art methods. The silicon nitride layer 23 acts as an etch stop during the formation of the interconnect channels 51. Because of film thickness and etch rate variations across the substrate, the etch step used to form the interconnect channels 51 would etch a significant amount of the BPSG layer beneath the interconnect channels 51 if the silicon nitride layer 23 were not present. The silicon nitride layer 23 allows a longer overetch during the interconnect channel etch step without etching the BPSG layer. The longer overetch ensures that interconnect channels 51 are completely etched in all areas of the substrate regardless of variations in the thickness of silicon dioxide layer 50. The interconnect includes copper, which has a lower resistivity compared to aluminum. Therefore, a thinner interconnect can be used while giving the same or lower resistance and a higher reliability. The polishing step forms a substantially planar substrate surface. (Note, when used in this context, "substrate" includes the semiconductor substrate as well as all layers fabricated on the semiconductor substrate up to the point of processing under discussion. Therefore, substrate surface refers to the present uppermost surface of the substrate, including all structures formed thereon.) Therefore, additional steps required for planarization schemes are not needed. The copper within the interconnects is encapsulated to prevent copper diffusion into a silicon dioxide layer. FIG. 8 illustrates the copper being surrounded by the titanium nitride barrier layer 60 and the silicon oxynitride passivation layer 80. Titanium nitride and silicon oxynitride act as diffusion barriers to the copper.

Furthermore, in the prior art, an interconnect formed by deposition of a metal layer, patterning and etch must be wider than the width of the contact region with which the interconnect is making connection in the area where contact is made. This is due to the fact that the patterning layer can be misaligned. If the interconnect line width were equal to the contact region width, then the misalignment would allow etchant to reach the contact fill material. Since the contact fill material and the interconnect material are usually the same or similar materials, this causes etching of the contact fill during the interconnect etch. Generally, in the prior art, the interconnect line must be at least as wide as the contact region plus twice the alignment tolerance (to allow for misalignment in any direction) in the area where it makes contact to a contact plug. This consumes a considerable amount of area on the chip, thereby limiting scaling. Although many prior art layouts stagger the location of contact regions to minimize the effect, the presence of the widened region on each interconnect line causes adjacent interconnects to be spaced further apart than if no widened region were present.

In contrast to the prior art, the interconnects of the present invention can be the same width at the contact region, even if both the interconnect and the contact fill are formed of the same metal. For example, the interconnect formed by layers 60 and 61 in interconnect channel 51 overlying the contact plug formed by layers 40 and 41 of FIG. 8 needs only be as wide as the contact plug. (Although it can be wider, as shown). As can be readily appreciated, even if the interconnect is only as wide as the contact plug, there will be no etching of the contact plug when the interconnect is formed by polishing as described above. This is true even if the interconnect channel 50 had been misaligned as no etchant can reach the contact plug since polishing proceeds only until the upper level of silicon dioxide layer 50 is reached.

The present invention may be used to form more than one level of interconnects as shown in FIG. 9. After polishing the substrate (FIG. 7), a second silicon nitride layer 90, a second silicon dioxide layer 91, and a third silicon nitride layer 92 are deposited over the substrate. The three layers are patterned to form a via opening to one of the first level interconnects. A second titanium nitride layer 93 and a second tungsten layer 94 are deposited and anisotropically etched to form a via plug within the via opening. Formation of the via opening and the via plug is similar to the formation of the contact opening and the contact plug. A contact plug makes electrical contact between the first interconnect level and the silicon substrate, whereas a via plug makes electrical contact between different interconnect levels. A third silicon dioxide layer 95 is deposited and patterned to form a second level interconnect channel. The third silicon nitride layer 92 acts as an etch stop during the formation of the second level interconnect channels. A second titanium nitride barrier layer 96 and a second copper metal layer 97 are deposited and chemically mechanically polished to form a second level interconnect. Formation of the second level interconnect channel and the second level interconnect are similar to formation of the first level interconnect channel and the first level interconnect, respectively. Other interconnect levels may be formed in a similar manner. After forming all of the interconnect levels, a silicon oxynitride passivation layer 98 is deposited over the substrate. Referring to FIG. 9, copper is encapsulated by titanium nitride and silicon nitride or titanium nitride and silicon oxynitride.

FIGS. 10 and 11 illustrate an alternate embodiment of the present invention. In general, metals other than copper can be used to form interconnects according to the methods of the present invention. However, the chemical mechanical polishing works best with methods which are deposited conformally, and is therefore preferably used with metals which are CVD deposited or are otherwise reflowed. Although aluminum or aluminum alloys, for example, are difficult to deposit conformally, they can be used in the alternate embodiment described herein. Briefly referring to FIG. 3, the BPSG layer 22 and the silicon nitride layer 23 are deposited and patterned to form the contact opening 30 to the N⁺ region 21. A tungsten layer is chemically deposited and anisotropically etched to form a contact plug 100 as shown in FIG. 10. A silicon dioxide layer 101 is deposited in the range of approximately 0.5–1.0μ thick and patterned to form interconnect channels about 0.8 μm wide. The silicon nitride layer 23 and the contact plug 100 act as etch stops during the interconnect channel formation. An aluminum or aluminum alloy layer 102 is sputter deposited to a thickness of about 8000 Å. The substrate is chemically mechanically polished with the polishing solution described above to remove the aluminum layer 102 that lies over the patterned silicon dioxide layer 101 to form interconnects within the interconnect channels as shown in FIG. 11. Other additional interconnect levels may be formed (not shown). A passivation layer comprising silicon oxynitride or phosphosilicate glass is deposited over the uppermost interconnect level (not shown). The aluminum interconnects are not encapsulated because aluminum does not diffuse into silicon dioxide as opposed to copper. Since aluminum has a higher resistivity than copper, the line width of the aluminum interconnect of FIG. 1 is greater than the line width of the copper interconnects of FIG. 9. The tungsten contact plug acts as a diffusion barrier between the aluminum interconnect and the N⁺ region. Therefore, silicon is not needed within the aluminum layer.

FIG. 12 illustrates a further alternate embodiment that encapsulates an interconnect so that it does not diffuse into adjacent layers. Briefly referring to FIG. 5, the substrate includes the N⁺ region 21, the patterned BPSG layer 22, and silicon nitride layer 23, the contact plug including the titanium nitride layer 40 and the tungsten layer 41, and patterned silicon dioxide layer 50 (not shown in FIG. 12) including interconnect channels 51 (not shown in FIG. 12) that are formed as described above. A copper metal layer 120 is deposited over the patterned silicon dioxide layer 50 and within the interconnect channels 51 and chemically mechanically polished with an alkaline polishing solution to form copper interconnects 120 that lie on the contact plug and part of the patterned silicon nitride layer as shown in FIG. 12. The patterned silicon dioxide layer is removed and a second silicon nitride layer 121 is deposited over the copper interconnects. A second silicon dioxide layer 122 is deposited over silicon nitride layer and is planarized by, for example, polishing. A silicon oxynitride passivation layer 123 is deposited over the second silicon dioxide 122 and the second silicon nitride layer 121. The copper interconnects are encapsulated by silicon nitride layers or the silicon nitride layers and the contact plug. Other materials such as molybdenum or tantalum may be used in place of the titanium nitride layer 40 of the contact plug. Also, molybdenum or tantalum may be used in place of the second silicon nitride layer 121, with some additional processing. Unlike the second silicon nitride layer 121, a molybdenum or tantalum layer over the copper interconnects 120 must be formed such that the top and sides of the interconnects 120 are covered, yet, the interconnects must not be electrically connected to each other. This can be done, for example, by an isotropic etching of material from the spaces or by selective deposition. The second silicon nitride layer 121 should be used with this embodiment to avoid the extra patterning step that may be difficult to perform because of narrow spaces between interconnect lines. Other interconnect levels may be formed before the passivation layer is deposited over the substrate.

FIG. 13 shows a further alternate embodiment including the substrate having the N⁺ region 21. A BPSG layer 130 is deposited to a thickness of about 9000 Å and patterned to form a contact opening about 0.5 μm wide. A tungsten layer is chemically deposited over the patterned BPSG layer 130 and within the contact opening. The tungsten layer 131 is anisotropically etched to form a contact plug within the contact opening. A silicon dioxide layer 132 is deposited to about 8000 Å thick and patterned to form interconnect channels about 0.1 μm wide or greater. Because no etch stop is used, the silicon dioxide thickness and etch rate across the substrate need to be reasonably uniform to minimize overetch during interconnect channel etch step. A gold layer 133 is deposited over the patterned silicon dioxide layer and within the interconnect channels. The gold layer is deposited at least until the interconnect channels are filled. The substrate is chemically mechanically polished to form gold interconnects 133. Additional interconnect levels may be formed. After all interconnect levels are formed, a passivation layer comprising silicon oxynitride or phosphosilicate glass is deposited over the substrate. The gold interconnects 133 are not encapsulated because gold has a significantly lower diffusion rate into silicon dioxide compared to copper.

FIG. 14 illustrates, in flow diagram form, one method for use in fabricating a semiconductor device for the present invention. The above discussion regarding the formation of interconnections, as illustrated in FIGS. 1–13 for example, that is not inconsistent with the following discussion applies to the method of FIG. 14. The method of FIG. 14 may be used for fabricating various semiconductor devices including microprocessors, controllers, or semiconductor memories, for example.

FIGS. 15–24 are used to better illustrate the method of FIG. 14. FIGS. 15–24 illustrate for one embodiment cross-sectional views of a semiconductor substrate fabricated using the method of FIG. 14 for forming interconnections that make electrical contact to a diffusion region 321 within a semiconductor substrate 320. For the description of the method of FIG. 14, the term substrate includes not only a semiconductor substrate, such as semiconductor substrate 320, but also any and all layers and structures fabricated over the semiconductor substrate up to the point of processing under discussion.

The method of FIG. 14 may be used to form interconnects for other purposes. The method of FIG. 14, for example, may be used to make electrical contact to various device structures including polysilicon gates, word lines, source regions, drain regions, bit lines, bases, emitters, collectors, etc. The method of FIG. 14 may be used with any suitable semiconductor technology including NMOS, PMOS, CMOS, BiCMOS, bipolar, multi-chip modules (MCM), and III–VI semiconductors.

For the method of FIG. 14, a semiconductor substrate is provided. FIG. 15 illustrates for one embodiment a cross-sectional view of semiconductor substrate 320 having diffusion region 321. Semiconductor substrate 320 may include, for example, a monocrystalline silicon (Si) substrate 320, and diffusion region 321 may be, for example, an $N^+$ region 321. Semiconductor substrate 320 may include any suitable semiconductor material. Diffusion region 321 may include any suitable doped region.

For step 200 of FIG. 14, a patterned dielectric layer is formed over a semiconductor substrate to define a first opening. For one embodiment, as illustrated in FIG. 15, a dielectric layer 322 is first formed over substrate 320. Dielectric layer 322 may include, for example, silicon dioxide ($SiO_2$) that has been deposited to a thickness of approximately 8000 Å using a suitable chemical vapor deposition (CVD) technique, for example. Other suitable thicknesses of $SiO_2$, for example in the range of approximately 5000 Å to approximately 10,000 Å, may also be used. Dielectric layer 322 may include any suitable dielectric material or materials, including silicon dioxide ($SiO_2$), silicon nitride (SiN), silicon oxynitride (SiON), phosphosilicate glass (PSG), borophosphosilicate glass (BPSG), fluoropolymer, parylene, polyimide, any suitable spin-on glass, or any suitable spin-on polymer for example. Dielectric layer 322 may be formed to any suitable thickness using any suitable technique that may depend, for example, on the material or materials used.

As illustrated in FIG. 16, dielectric layer 322 is patterned to define a contact opening 330 over at least a portion of diffusion region 321. Any suitable patterning technique may be used to define contact opening 330 in dielectric layer 322. For example, a patterned photoresist layer may be formed over dielectric layer 322 and used as a mask in etching dielectric layer 322 to form contact opening 330. The photoresist layer may then be stripped from the substrate, and the substrate may be suitably cleaned to remove residue from contact opening 330, for example.

Contact opening 330 may be formed to have any suitable width, such as approximately 0.25 µm for example. Contact opening 330 extends to diffusion region 321, exposing at least a portion of diffusion region 321 in dielectric layer 322.

For step 205 of FIG. 14, the first opening is filled with a suitable conductive material or materials. For one embodiment, as illustrated in FIG. 17, contact opening 330 is filled with a barrier layer 340 and a conductive layer 342. Barrier layer 340 serves as a diffusion barrier layer, preventing conductive layer 342 from diffusing into diffusion region 321 or into dielectric layer 322.

Barrier layer 340 is first formed over the substrate, covering the sidewalls and bottom in contact opening 330. Barrier layer 340 may include any suitable conductive material or materials, including titanium nitride (TiN), tungsten (W), tantalum (Ta), titanium tungsten (TiW), tantalum silicon nitride (TaSiN), tungsten nitride ($W_xN_y$), niobium (Nb), or molybdenum (Mo) for example, and may be formed using any suitable technique. Barrier layer 340 is preferably formed to a thickness sufficient to serve as a diffusion barrier for conductive layer 342. Conductive layer 342 is then formed over the substrate, substantially filling contact opening 330. Conductive layer 342 may include any suitable conductive material, including copper (Cu), tungsten (W), gold (Au), or silver (Ag) for example, and may be formed to any suitable thickness using any suitable technique.

For one embodiment, barrier layer 340 includes titanium nitride (TiN) that has been deposited to a thickness of approximately 300 Å, for example. Other suitable thicknesses of TiN, for example in the range of approximately 100 Å to approximately 1500 Å, may also be used. Conductive layer 342 includes copper (Cu) that has been deposited to a thickness of approximately 1.0 µm for this embodiment. Other suitable thicknesses of Cu may also be used and may depend, for example, on the thickness of barrier layer 340 and on the size of contact opening 330. TiN serves as a diffusion barrier for Cu, preventing Cu from diffusing into diffusion region 321 or dielectric layer 322. Contact opening 330 is to be substantially filled with a contact plug that includes TiN and Cu. Both TiN and Cu may be deposited using suitable deposition techniques, including CVD techniques for example.

As illustrated in FIG. 18, barrier layer 340 and conductive layer 342 are then planarized to the surface of the substrate, that is until portions of barrier layer 340 and conductive layer 342 have been removed from the top surface of dielectric layer 22. Contact opening 330 remains filled with a contact plug, including barrier layer 340 and conductive layer 342. Any suitable technique may be used to planarize the substrate and may depend, for example, on the material used for conductive layer 42 and barrier layer 340.

For one embodiment, the substrate is polished with a suitable chemical mechanical polishing (CMP) technique using a suitable polishing solution or slurry depending, for example, on the materials used for barrier layer 340 and conductive layer 342. Suitable CMP techniques may include, for example, those described in U.S. Pat. No. 5,340,370, entitled SLURRIES FOR CHEMICAL MECHANICAL POLISHING, by Kenneth C. Cadien and Daniel A. Feller, and assigned to the assignee of the present patent application. The CMP technique is to remove barrier layer 340 and conductive layer 342 from the surface of dielectric layer 322, leaving a substantially planar surface over the substrate suitable for forming higher level interconnect layers, for example. Dielectric layer 322 may preferably serve as a polish stop in removing barrier layer 340 and conductive layer 342 with a CMP technique. Barrier layer 340 and conductive layer 342 may be removed from the surface of dielectric layer 322 using other suitable techniques, including a suitable anisotropic etch for example.

For other embodiments, contact opening 330 may be filled with any suitable conductive material or materials using any suitable technique to form the contact plug in dielectric layer 322. The material or materials used may depend, for example, on whether the selected material is susceptible to diffusion into dielectric layer 322 and/or diffusion region 321. Contact opening 330 may be filled using any suitable technique, including suitable plating, electro, electroless, or CVD selective deposition techniques for example.

For step 210 of FIG. 14, an etch-stop layer is formed over the substrate. As illustrated in FIG. 19, for example, an etch-stop layer 323 is formed over dielectric layer 322 and the contact plug that includes barrier layer 340 and conductive layer 342. Etch-stop layer 323 serves as an etch-stop layer for a subsequent etch step. Etch-stop layer 323 may include any suitable material, including silicon nitride (SIN), silicon oxynitride (SiON), boronitride (BN), silicon boronitride (SiBN), or silicon carbide (SiC) for example, and may be formed to any suitable thickness using any suitable technique.

As etch-stop layer 323 may be formed over more than one conductive plug formed in dielectric layer 322, etch-stop layer 323 may contain any suitable dielectric material to prevent electrical shorting among such plugs. With a conductive material for etch-stop layer 323, etch-stop layer 323 is to be suitably etched between each plug to prevent electrical shorting. This etch, however, requires additional process steps and may pose difficult alignment problems as any conductive material overlying dielectric layer 322 is to be removed. With sub-micron contact openings and sub-micron spacings between plugs, the alignment of a mask to protect those portions of etch-stop layer 323 that overly the plugs may prove difficult.

For one embodiment, etch-stop layer 323 includes silicon nitride (SiN) that is deposited over the substrate to a thickness of approximately 1000 Å. Other suitable thicknesses of SiN, for example in the range of approximately 300 Å to approximately 1500 Å, may also be used. The thickness of SiN used, though, should not be as great as to significantly decrease device performance, for example, as a result of any increased capacitance because of the relatively high dielectric constant SiN has as compared to that for silicon dioxide ($SiO_2$), for example.

For step 215 of FIG. 14, a patterned dielectric layer is formed over the substrate to define another opening. For one embodiment, as illustrated in FIG. 20, a dielectric layer 350 is first formed over etch-stop layer 323. Dielectric layer 350 may include, for example, silicon dioxide ($SiO_2$) that has been deposited to a thickness of approximately 8000 Å using a suitable chemical vapor deposition (CVD) technique, for example. Other suitable thicknesses of $SiO_2$, for example in the range of approximately 5000 Å to approximately 10,000 Å, may also be used.

Dielectric layer 350 may include any suitable dielectric material or materials, including silicon dioxide ($SiO_2$), silicon nitride (SiN), silicon oxynitride (SiON), phosphosilicate glass (PSG), borophosphosilicate glass (BPSG), fluoropolymer, parylene, polyimide, any suitable spin-on glass, or any suitable spin-on polymer for example. Dielectric layer 350 may be formed to any suitable thickness using any suitable technique that may depend, for example, on the material or materials used.

Dielectric layer 350 is patterned to define an interconnect channel over at least a portion of the contact plug formed over diffusion region 321. Any suitable patterning technique may be used to define this interconnect channel in dielectric layer 350. For example, a patterned mask layer 352 as illustrated in FIG. 20 may first be formed over dielectric layer 350. Patterned mask layer 352 may include any suitable mask material, including photoresist for example, to pattern dielectric layer 350. Patterned mask layer 352 defines an opening 353 over the contact plug in dielectric layer 322.

Patterned mask layer 352 is used as a mask in etching dielectric layer 350 to form interconnect channel 351 as illustrated in FIG. 21. Any suitable etch technique may be used to etch dielectric layer 350.

A suitable selective etch technique, for example, may be used to etch the material from dielectric layer 350 at a relatively greater rate as compared to the rate the technique etches the material from mask layer 352 and from etch-stop layer 323. More clearly, a selective etch may be used such that mask layer 352 serves as a mask and such that etch-stop layer 323 serves as an etch stop in etching dielectric layer 350. The selective etch technique used may depend, for example, on the materials used for mask layer 352, dielectric layer 350, and etch-stop layer 323. As dielectric layer 350 is to be etched at a relatively greater rate as compared to that for mask layer 352 and etch-stop layer 323, the material used for dielectric layer 350 differs from the material used for mask layer 352 and etch-stop layer 323.

For one embodiment where photoresist is used for mask layer 352, where silicon dioxide ($SiO_2$) is used for dielectric layer 350, and where silicon nitride (SiN) is used for etch-stop layer 323, a selective oxide:nitride etch technique may be used to etch dielectric layer 350 to define interconnect channel 351. This etch technique may have any suitable selectivity to etch silicon dioxide from dielectric layer 350 without significantly etching silicon nitride from etch-stop layer 323. Where dielectric layer 350 includes $SiO_2$ approximately 8000 Å in thickness and where etch-stop layer 323 includes SiN approximately 1000 Å in thickness, for example, a selective oxide:nitride etch with a selectivity of approximately 20:1, for example, may be used. Other suitable selectivities may also be used and may depend, for example, on the thicknesses of $SiO_2$ and SiN used for dielectric layer 350 and etch-stop layer 323, respectively.

Mask layer 352 is then removed from the substrate. The substrate may be suitably cleaned to remove residue from interconnect channel 351, for example.

Etch-stop layer 323 may serve to protect underlying dielectric layer 322 while interconnect channel 351 is being formed from dielectric layer 350. To form reliable interconnects using interconnect channels in dielectric layer 350, such as interconnect channel 351 for example, the etch technique preferably removes substantially all of the dielectric material from these interconnect channels in all areas of the substrate. As dielectric layer 350 may vary in thickness across the substrate and as the etch rate may vary across the substrate, interconnect channel 351 as well as other interconnect channels from dielectric layer 350 may be subjected to the etch technique longer than necessary—that is subjected to an overetch—to help ensure that every interconnect channel in all areas of the substrate has been fully etched from dielectric layer 350.

Without etch-stop layer 323 portions of dielectric layer 322 exposed in interconnect channel 351 may become significantly etched as a result of any overetch, resulting in a non-planar bottom surface profile for interconnect channel 351. This is so, for example, where the same material is used for dielectric layer 322 and dielectric layer 350. As barrier materials with relatively poor step coverage may not completely cover the non-planar bottom surface profile of interconnect channel 351, a subsequent interconnect material that is to be encapsulated by such a barrier material may diffuse into dielectric layer 322 and/or dielectric layer 350 and thus create electrical shorts in the interconnect structure. A non-planar bottom surface profile for interconnect channel 351 may also lead to void formation in forming the interconnect with interconnect channel 351, for example where the interconnect material is conformally deposited in interconnect channel 351.

Because of etch-stop layer 323, interconnect channel 351 may be subjected to a longer overetch, helping to ensure interconnect channels in all areas of the substrate are fully etched from dielectric layer 350 without etching into dielectric layer 322. This is so despite any variations in thickness of dielectric layer 350 across the substrate and/or in etch rate across the substrate.

Etch-stop layer 323 also protects the profile of interconnect channel 351 with a relatively planar bottom surface. This allows barrier materials that have relatively poor step coverage to be used in forming an interconnect with interconnect channel 351 with relatively less risk of creating electrical shorts as a result of diffusion of a subsequent interconnect material into dielectric layer 322 and/or dielectric layer 350. Furthermore, the relatively planar profile of the bottom of interconnect channel 351 allows interconnect materials to be conformally formed in interconnect channel 351 with minimal, if any, void formation in the interconnect.

Etch-stop layer 323 may also be formed with a suitable material to serve as a protective layer to prevent the contact plug in dielectric layer 322 from becoming exposed to various process steps to which the substrate is subjected. Etch-stop layer 323 may protect the contact plug from becoming exposed to process steps used in forming interconnect channel 351, for example.

For one embodiment where conductive layer 342 of the contact plug in dielectric layer 322 includes copper (Cu), where patterned mask layer 352 includes photoresist, and where etch-stop layer 323 includes silicon nitride (SiN), etch-stop layer 323 prevents the copper in the contact plug from becoming exposed to the photoresist strip technique used to remove mask layer 352, for example. Copper should not be exposed to any solvent, polymer removal chemistry, or oxygen plasma, for example, used for the resist strip as the copper may corrode and oxidize and thus become less reliable as an electrical conductor.

Etch-stop layer 323 may further be formed with a suitable material to serve as a diffusion barrier, for example, to prevent the contact plug in dielectric layer 322 from diffusing into dielectric layer 350. Interconnect channel 351 may not overlie all of the contact plug formed in dielectric layer 322, for example because of any misalignment in forming interconnect channel 351 over the contact plug in dielectric layer 322 or because interconnect channel 351 is formed having a width less than that of the contact plug in dielectric layer 322. Where the contact plug in dielectric layer 322 includes conductive material 342 that is to be suitably encapsulated to prevent diffusion into surrounding layers, etch-stop layer 323 preferably includes a suitable barrier material to prevent conductive layer 342 from diffusing into dielectric layer 350.

For one embodiment where conductive layer 342 of the contact plug in dielectric layer 322 includes copper (Cu) and where dielectric layer 350 includes silicon dioxide (SiO$_2$), etch-stop layer 323 may include silicon nitride (SiN), for example, to prevent the Cu in the contact plug from diffusing into the SiO$_2$ of dielectric layer 350.

Interconnect channel 351 may be formed to have any suitable width. Interconnect channel 351 may have a width that is approximately the same as that for contact opening 330 for example. For an approximately 0.25 µm wide contact opening 330, interconnect channel 351 may be approximately 0.25 µm in width, for example. Interconnect channel 351 may also be approximately 1.0 µm or greater in width. The width of interconnect channel 351 may depend, for example, on the resistivity of the conductive material used for creating an interconnect with interconnect channel 351. Interconnect channel 351 may be relatively narrower, for example, where conductive material having a relatively lower resistivity is used to create an interconnect with interconnect channel 351. Interconnect channel 351 extends to etch-stop layer 323, exposing a portion of etch-stop layer 323 in dielectric layer 350.

For step 220 of FIG. 14, the etch-stop layer exposed in the other opening is removed. As illustrated in FIG. 22, for example, the portion of etch-stop layer 323 that is exposed in interconnect channel 351 as illustrated in FIG. 21 has been removed. To remove the exposed portion of etch-stop layer 323, any suitable technique may be used and may be followed by a suitable cleaning step. Preferably the technique and any subsequent cleaning process subject the contact plug in dielectric layer 322 to minimal, if any, contamination or other damage in removing etch-stop layer 323. Removal of the exposed portion of etch-stop layer 323 serves to pattern etch-stop layer 323, creating an opening in etch-stop layer 323 that is approximately equal in width to interconnect channel 351.

For one embodiment where conductive layer 342 of the contact plug in dielectric layer 322 includes copper (Cu), the technique used to remove etch-stop layer 323 preferably subjects this copper to minimal, if any, oxidation as the contact plug may otherwise become less reliable as an electrical conductor.

A suitable selective etch technique, for example, may be used to etch the material from etch-stop layer 323 at a relatively greater rate as compared to the rate the technique etches the material from dielectric layer 350. More clearly, a selective etch may be used such that dielectric layer 350 serves as a mask in etching etch-stop layer 323. The selective etch technique used may depend, for example, on the materials used for dielectric layer 350 and etch-stop layer 323. As etch-stop layer 323 is to be etched at a relatively greater rate as compared to that for dielectric layer 350, the material used for etch-stop layer 323 differs from the material used for dielectric layer 350.

The selective etch technique may also depend on the material used for dielectric layer 322 as a portion of dielectric layer 322 may become exposed to the selective etch technique in removing etch-stop layer 323. Where for example interconnect channel 351 is greater in width as compared to the contact plug in dielectric layer 322, as illustrated in FIG. 22, underlying dielectric layer 322 preferably serves as an etch-stop in etching layer 323 from interconnect channel 351 to preserve the relatively planar bottom surface profile for interconnect channel 351.

For one embodiment where silicon dioxide (SiO$_2$) is used for dielectric layer 350 and where silicon nitride (SiN) is used for etch-stop layer 323, a selective nitride:oxide etch technique may be used to remove exposed nitride in interconnect channel 351. This etch technique may have any suitable selectivity to etch the exposed nitride from etch-stop layer 323 without significantly etching silicon dioxide from dielectric layer 350. Where etch-stop layer 323 includes SiN approximately 1000 Å in thickness and where dielectric layer 350 includes SiO$_2$ approximately 8000 Å in thickness, for example, a selective nitride:oxide etch with a selectivity of approximately 2:1, for example, may be used. Other suitable selectivities may also be used and may depend, for example, on the thicknesses of SiO$_2$ and SiN used for dielectric layer 350 and etch-stop layer 323, respectively. Where underlying dielectric layer 322 may become exposed to the nitride:oxide selective etch technique in interconnect channel 351, underlying dielectric layer 322 preferably contains silicon dioxide (SiO$_2$) to serve as an etch-stop in etching SiN layer 323.

For step 225 of FIG. 14, the other opening is filled with a suitable conductive material or materials. For one embodiment, as illustrated in FIG. 23, interconnect channel 351 is filled with a barrier layer 360 and a conductive layer

361. Barrier layer 360 may serve as a diffusion barrier layer, preventing conductive layer 361 from diffusing into dielectric layer 350 and/or dielectric layer 322.

Barrier layer 360 is first formed over the substrate, covering the sidewalls and bottom in interconnect channel 351. Barrier layer 360 may include any suitable conductive material or materials, including titanium nitride (TiN), tungsten (W), tantalum (Ta), titanium tungsten (TiW), tantalum silicon nitride (TaSiN), tungsten nitride ($W_xN_y$), niobium (Nb), or molybdenum (Mo) for example, and may be formed using any suitable technique. Barrier layer 360 is preferably formed to a thickness sufficient to serve as a diffusion barrier for conductive layer 361. Conductive layer 361 is then formed over the substrate, substantially filling interconnect channel 351. Conductive layer 361 may include any suitable conductive material, including copper (Cu), tungsten (W), gold (Au), or silver (Ag) for example, and may be formed to any suitable thickness using any suitable technique.

As etch-stop layer 323 protected the profile of interconnect channel 351 with a relatively planar bottom surface as discussed above, barrier layer 360 may be deposited with a material having relatively poor step coverage with relatively less risk of creating electrical shorts through diffusion of conductive layer 361 into dielectric layer 322 and/or dielectric layer 350. Furthermore, the relatively planar profile of the bottom of interconnect channel 351 allows barrier layer 360 and conductive layer 361 to be conformally formed in interconnect channel 351 with minimal, if any, void formation in the interconnect.

For one embodiment, barrier layer 360 includes titanium nitride (TiN) that has been deposited to a thickness of approximately 300 Å, for example. Other suitable thicknesses of TiN, for example in the range of approximately 100 Å to approximately 1500 Å, may also be used. Conductive layer 361 includes copper (Cu) that has been deposited to a thickness of approximately 1.0 μm. Other suitable thicknesses of Cu may also be used and may depend, for example, on the thickness of barrier layer 360 and on the size of interconnect channel 351. Because copper has a lower resistivity as compared to aluminum (Al), for example, a relatively narrower interconnect may be fabricated with relatively lesser risk of relatively higher resistivities. TiN serves as a diffusion barrier for Cu, preventing Cu from diffusing into dielectric layer 350 and/or dielectric layer 322. Interconnect channel 351 is to be substantially filled with TiN and Cu. Both TiN and Cu may be deposited using suitable deposition techniques, including CVD techniques for example.

As illustrated in FIG. 24, barrier layer 360 and conductive layer 361 are then planarized to the surface of the substrate, that is until portions of barrier layer 360 and conductive layer 361 have been removed from the top surface of dielectric layer 350. Interconnect channel 351 remains filled with barrier layer 360 and conductive layer 361. Any suitable technique may be used to planarize the substrate and may depend, for example, on the material used for conductive layer 361 and barrier layer 360.

For one embodiment, the substrate is polished with a suitable chemical mechanical polishing (CMP) technique using a suitable polishing solution or slurry depending, for example, on the materials used for barrier layer 360 and conductive layer 361. Suitable CMP techniques may include, for example, those described in U.S. Pat. No. 5,340,370, entitled SLURRIES FOR CHEMICAL MECHANICAL POLISHING, by Kenneth C. Cadien and Daniel A. Feller, and assigned to the assignee of the present patent application. The CMP technique is to remove barrier layer 360 and conductive layer 361 from the surface of dielectric layer 350, leaving a substantially planar surface over the substrate suitable for forming higher level interconnect layers, for example. Dielectric layer 350 may preferably serve as a polish stop in removing barrier layer 360 and conductive layer 361 with a CMP technique. Barrier layer 360 and conductive layer 361 may be removed from the surface of dielectric layer 350 using other suitable techniques, including an anisotropic etch for example.

For other embodiments, interconnect channel 351 may be filled with any suitable conductive material or materials using any suitable technique to form the interconnect in dielectric layer 350. The material or materials used may depend, for example, on whether the selected material is susceptible to diffusion into dielectric layer 322 and/or dielectric layer 350. Interconnect channel 351 may be filled with any suitable conductive material, including aluminum (Al) for example, that does not diffuse into dielectric layer 322 and/or dielectric layer 350. Interconnect channel 351 may be filled using any suitable technique, including suitable plating, electro, electroless, or CVD selective deposition techniques for example.

The method of FIG. 14 may also be used for one embodiment to create via layers and additional interconnect layers for a substrate. FIG. 25 is used to better illustrate the method of FIG. 14 in creating a via layer and another interconnect layer. The via layer may be formed by repeating step 210 through step 225 of FIG. 14. The additional interconnect layer may be similarly formed by repeating step 210 through step 225 of FIG. 14. The above discussion regarding step 210 through step 225 applies here as well.

For the via layer illustrated in FIG. 25, an etch-stop layer 390 is first formed for step 210 of FIG. 14. Etch-stop layer 390 is formed over dielectric layer 350 and the interconnect in dielectric layer 350 including conductive layer 361 and barrier layer 360. A patterned dielectric layer 391 is then formed for step 215 of FIG. 14 over etch-stop layer 390 to define a via opening over at least a portion of the interconnect in dielectric layer 350. The via opening may be formed to have any suitable width, such as approximately 0.25 μm for example. For step 220 of FIG. 14, the exposed portion of etch-stop layer 390 is removed from the via opening. The via opening is then filled with a barrier layer 393 and a conductive layer 394 for step 225 of FIG. 14 to create a via plug in dielectric layer 391.

Etch-stop layer 390 may be formed with a suitable material to serve as a protective layer, prior to the removal of the exposed portion of etch-stop layer 390 for step 220 of FIG. 14, to prevent the interconnect in dielectric layer 350 from becoming exposed to various process steps to which the substrate is subjected. Etch-stop layer 390 may protect the interconnect from becoming exposed to process steps used in forming the via opening in dielectric layer 391, for example.

Etch-stop layer 390 may also be formed with a suitable material to serve as a diffusion barrier layer for conductive layer 361 of the interconnect in dielectric layer 350. Conductive layer 361, for example, may need to be encapsulated by a barrier layer from surrounding dielectric layers, as illustrated in FIG. 25, for diffusion purposes. Where the via opening formed in dielectric layer 391 has a width less than that of the interconnect in dielectric layer 350, as illustrated in FIG. 25, etch-stop layer 390 is preferably formed with a suitable barrier material to prevent conductive layer 361 from diffusing into dielectric layer 391, for example. For one embodiment, etch-stop layer 390 includes silicon nitride (SiN) to serve as a diffusion barrier Layer for copper (Cu) that is used to form conductive layer 361.

For the additional interconnect layer illustrated in FIG. 25, an etch-stop Layer 392 is first formed for step 210 of FIG. 14. Etch-stop layer 392 is formed over dielectric layer 391 and the via plug in dielectric layer 391 including conductive layer 394 and barrier layer 393. A patterned dielectric layer 395 is then formed for step 215 of FIG. 14 over etch-stop layer 392 to define an interconnect channel over at least a portion of the via plug in dielectric layer 391. For step 220 of FIG. 14, the exposed portion of etch-stop layer 392 is removed from the interconnect channel. The interconnect channel is then filled with a barrier layer 396 and a conductive layer 397 for step 225 of FIG. 14 to create an interconnect in dielectric layer 395.

As illustrated in FIG. 25, the method of FIG. 14 may be used to form suitable contacts, interconnects, and/or vias with encapsulated conductive materials that are prevented from diffusing into adjacent layers by suitable barrier materials. Because these conductive materials may be encapsulated, the method of FIG. 14 may provide for more flexibility when selecting materials for forming interconnections for semiconductor devices.

For one embodiment, conductive layers 342, 361, 394, and 397 include copper (Cu), and dielectric layers 322, 350, 391, and 395 include silicon dioxide ($SiO_2$). Conductive layer 342, for example, is encapsulated by barrier layer 340 that includes titanium nitride (TiN), for example, and barrier layer 360 that includes titanium nitride (TiN), for example. As another example, conductive layer 361 is encapsulated by barrier layer 360 that includes titanium nitride (TiN), for example, barrier layer 390 that includes silicon nitride (SiN), and barrier layer 393 that includes titanium nitride (TIN), for example.

Additional via and interconnect layers may be similarly formed, for example, over the substrate illustrated in FIG. 25. A passivation layer may be formed over an uppermost interconnect layer, for example. The passivation layer may include any suitable material, including silicon oxynitride (SiON) or phosphosilicate glass (PSG) for example. The material used for the passivation layer may depend, for example, on any interconnect material exposed in the uppermost layer as this material may need to be encapsulated by a barrier material. Where, for example, copper (Cu) is used for the uppermost interconnects and exposed at this interconnect layer, a silicon oxynitride passivation layer may be used as a barrier layer for the copper.

In the foregoing description, the invention has been described with reference to specific embodiments thereof. It will, however, be evident that various modifications and changes may be made thereto without departing from the broader spirit or scope of the present invention as defined in the appended claims. The specification and drawings are, accordingly, to be regarded in an illustrative rather than a restrictive sense.

What is claimed is:

1. A semiconductor device comprising:

(a) a semiconductor substrate;

(b) a first patterned dielectric layer disposed over the semiconductor substrate, the first patterned dielectric layer having a first dielectric material and having a first opening filled with first conductive material, the first conductive material being adjacent to and in direct contact with the dielectric layer;

(c) a second patterned dielectric layer disposed over the first patterned dielectric layer, the second patterned dielectric layer having a second dielectric material and having a second opening; and (d) a third patterned dielectric layer disposed over the second patterned dielectric layer, the third patterned dielectric layer having a third dielectric material and having a third opening over the second opening and over at least a portion of the first conductive material, wherein the bottom of the third opening is approximately equal in width and aligned to the second opening;

wherein the second opening and the third opening are filled with second conductive material over at least a portion of the first conductive material.

2. The device of claim 1, wherein the second opening is greater in width than the first opening.

3. The device of claim 1, wherein the second dielectric material includes silicon nitride.

4. The device of claim 1, wherein the third dielectric material includes silicon dioxide.

5. The device of claim 4, wherein the second dielectric material includes silicon nitride.

6. The device of claim 1, wherein the first opening has a bottom and sidewalls, and wherein the first conductive material includes a barrier layer over the bottom and sidewalls of the first opening and includes a conductive layer over the barrier layer.

7. The device of claim 6, wherein the conductive layer includes copper.

8. The device of claim 7, wherein the barrier layer includes titanium nitride.

9. The device of claim 6, wherein the second patterned dielectric layer overlies a portion of the conductive layer, and wherein the second dielectric material includes a barrier material for the conductive layer, the barrier material being disposed adjacent to the conductive layer.

10. The device of claim 9, wherein the second dielectric material includes silicon nitride.

11. The device of claim 9, wherein the first opening is greater in width than the second opening.

12. The device of claim 6, wherein the second opening and the third opening have a bottom and sidewalls, and wherein the second conductive material includes a second barrier layer over the bottom and sidewalls of the second and third openings and includes a second conductive layer over the second barrier layer.

13. The device of claim 12, wherein the second conductive layer includes copper.

14. The device of claim 13, wherein the second barrier layer includes titanium nitride.

* * * * *